(12) United States Patent
Chakraborty

(10) Patent No.: US 11,979,161 B2
(45) Date of Patent: May 7, 2024

(54) POLYPHASE PHASE SHIFTER

(71) Applicant: TEXAS INSTRUMENTS INCORPORATED, Dallas, TX (US)

(72) Inventor: Sudipto Chakraborty, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 170 days.

(21) Appl. No.: 17/828,190

(22) Filed: May 31, 2022

(65) Prior Publication Data

US 2022/0294436 A1     Sep. 15, 2022

Related U.S. Application Data

(63) Continuation of application No. 16/804,236, filed on Feb. 28, 2020, now Pat. No. 11,349,465, which is a continuation of application No. 15/853,955, filed on Dec. 25, 2017, now Pat. No. 10,581,415.

(51) Int. Cl.
| | |
|---|---|
| H03K 5/131 | (2014.01) |
| H04B 7/0452 | (2017.01) |
| H04B 7/08 | (2006.01) |
| H04J 1/08 | (2006.01) |
| H03K 5/00 | (2006.01) |

(52) U.S. Cl.
CPC ........... H03K 5/131 (2013.01); H04B 7/0452 (2013.01); H04B 7/084 (2013.01); H04J 1/08 (2013.01); *H03K 2005/00286* (2013.01)

(58) Field of Classification Search
CPC .................................................... H03K 5/131
USPC ........................................................ 327/234
See application file for complete search history.

(56) References Cited

U.S. PATENT DOCUMENTS

| | | | |
|---|---|---|---|
| 7,613,440 B2 | 11/2009 | Hijikata et al. | |
| 2003/0216131 A1 | 11/2003 | Kovacevic et al. | |
| 2004/0214547 A1* | 10/2004 | Kim ..................... | H03D 7/1433 |
| | | | 455/296 |
| 2005/0282510 A1 | 12/2005 | Bang et al. | |
| 2006/0014450 A1 | 1/2006 | Xu et al. | |
| 2007/0142019 A1 | 6/2007 | Mattisson et al. | |
| 2008/0254754 A1 | 10/2008 | Van Waasen et al. | |
| 2018/0331712 A1 | 11/2018 | O'Brien et al. | |

\* cited by examiner

*Primary Examiner* — Tomi Skibinski
(74) *Attorney, Agent, or Firm* — Michael T. Gabrik; Frank D. Cimino

(57) ABSTRACT

In described examples, a quadrature phase shifter includes digitally programmable phase shifter networks for generating leading and lagging output signals in quadrature. The phase shifter networks include passive components for reactively inducing phase shifts, which need not consume active power. Output currents from the transistors coupled to the phase shifter networks are substantially in quadrature and can be made further accurate by adjusted by a weight function implemented using current steering elements. Example low-loss quadrature phase shifters described herein can be functionally integrated to provide low-power, low-noise up/down mixers, vector modulators and transceiver front-ends for millimeter wavelength (mmwave) communication systems.

20 Claims, 10 Drawing Sheets

POLYPHASE PHASE SHIFTER

CROSS-REFERENCE TO RELATED APPLICATIONS

This application is a continuation of U.S. patent application Ser. No. 16/804,236, filed Feb. 28, 2020 (scheduled to issue as U.S. Pat. No. 11,349,465), which is a continuation of U.S. patent application Ser. No. 15/853,955 (now issued as U.S. Pat. No. 10,581,415), filed Dec. 25, 2017, each of which is herein incorporated by reference in its entirety.

BACKGROUND OF THE INVENTION

Next-generation communication systems include multiple-input, multiple-output (MIMO) transceivers to accommodate high throughput of data. For example, wideband communication systems for radar-based imaging and ranging applications can include high data throughput transceivers operating at millimeter wave frequencies. At such high frequencies, the power consumption and amount of noise generated by the transceivers can limit of the performance of the wideband communication systems.

SUMMARY

In described examples, a low-loss quadrature phase shifter includes digitally programmable phase shifter networks for generating leading and lagging output signals in quadrature. The phase shifter networks include passive components for reactively inducing phase shifts, which need not consume active power. Output currents from the transistors coupled to the phase shifter networks are substantially in quadrature and can be made further accurate by adjusted by a weight function implemented using current steering elements. Example low-loss quadrature phase shifters described herein can be functionally integrated to provide low-power, low-noise up/down mixers, vector modulators and transceiver front-ends for millimeter wavelength (mmwave) communication systems.

DETAILED DESCRIPTION

Figure 1A:
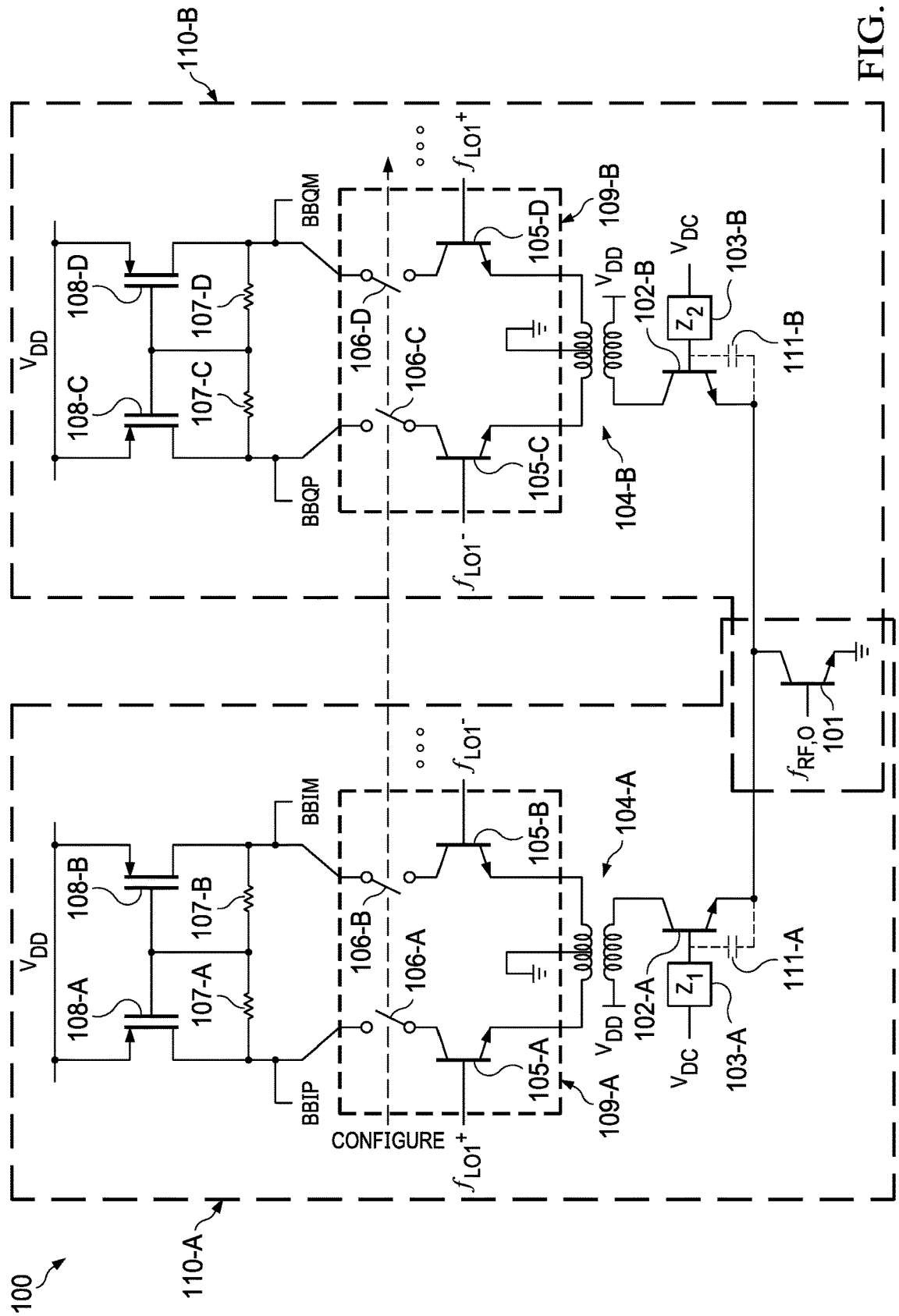
FIG. 1A is a schematic diagram of an example down-converting RF phase shifter mixer architecture in accordance with the description herein.

Certain terms are used throughout the following description—and claims—to refer to particular system components. As one skilled in the art will appreciate, various names can be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. For example, if a first device couples to a second device, that connection can be made through a direct electrical connection, or through an indirect electrical connection via other devices and connections. The term "portion" can mean an entire portion or a portion that is less than the entire portion.

Quadrature generation functionality can be integrated within up-conversion/down-conversion mixing circuits and vector modulators, as well as being included as part of a transceiver front-end. In some applications, phase shifters (which can be used in quadrature generation) are selected to include operating characteristics such as low power, low noise, and low power, and low voltage headroom. Various circuits for low power, high dynamic range transceivers are described hereinbelow.

Some transceivers include MIMO—(multiple-input, multiple-output) based transmitters for higher effective output power in response to controlling an (e.g., one- or two-dimensional) array of multiple low power transmitter elements for working concurrently. Selected individual transmitter elements of the number N of multiple low power transmitter elements are arranged to operate concurrently such that, for example, each power transmitter element transmits a signal including a different phase shift from the signals being transmitted via adjacent transmitter elements. For example, a signal transmitted via each selected power transmitter element can be a phase-shifted signal generated in response to phase-shifting a common-origin signal.

Similarly, MIMO-based receivers include an (e.g., one- or two-dimensional) array of receiver elements, for which each power receiver element is coupled to a respective antenna. Each such antenna is physically separated from an adjacent antenna by a fraction of wavelength (e.g., by a half wavelength). Selected individual receiver elements of the N receiver elements in the array can be selectively phase shifted for constructive combination in response to receiver back-end processing of the signals received via the selectively phase shifted N receiver elements in the array. The constructive combination of the receiver back-end processing achieves a higher signal-to-noise ratio for the combined signal when compared to any one of the individually received signals (e.g., based on each copy of the signals being correlated and constructively added in-phase, while noise is uncorrelated). The received signals are spatially filtered in response to constructive combination of a receiver back-end processing, which can result in higher effective signal-to-noise ratios (SNR) compared to each of the individual copies of the received signal obtained from a respective receiver element.

MIMO transmitters and receivers (e.g., transceivers) are in some emerging applications such as automotive radar as well as integrated circuits (ICs) for next-generation data communication systems (e.g., 5G-level services). Various communications systems using MIMO technologies are designed to be both compact and power efficient. To improve cost effectiveness, a reusable architecture is scalable in accordance with the respectively defined RF bands of usage assigned in various countries (e.g., the 28 GHz and 35 GHz bands assigned for some emerging systems). The reusable architecture is configurable to accommodate arrays of between (for example) 16 and 512 antennas (e.g., in accordance with a power of two). Such antennas are compact and can be arrayed in handheld devices and/or coupled to base stations, where the handheld devices and the base stations each include four antenna arrays arranged as a tile. As described hereinbelow, receivers and transmitters are selectively tunable to process two or more center frequencies (e.g., 28 GHz and 35 GHz).

As system complexity and levels of integration grow, the power consumption and areas of transmitters/receivers (transmitters, receivers, and/or transceivers) are minimized to conserve power and reduce processing cost (e.g., for achieving commercially viable solutions). Further, in accordance with various communications standards, a single sideband RF output is often required at the antenna (e.g., for conserving power). Accordingly, quadrature phase shifters described hereinbelow are selectable for single sideband signal processing and suitable for lower power operation.

At least three methods described hereinbelow for generating quadrature outputs include: (a) RF- (radio frequency-) level quadrature phase shifting, (b) baseband frequency-level quadrature phase shifting, and (c) mixer-based input-signal-to-output-signal conversion.

Various transmitter architectures operating in accordance with mixer-based input-signal-to-output-signal conversion are coupled to receive quadrature input signals (such as quadrature local oscillator—LO—signals) for generating output signals in accordance with:

$$\cos(\omega_{LO}+\omega_{BB})t = \cos(\omega_{LO}t)\cos(\omega_{BB}t) - \sin(\omega_{LO}t)\sin(\omega_{BB}t) \quad \text{(Eq. 1)}$$

where $\omega_{BB}$ is a first quadrature input signal at a baseband frequency, $\omega_{LO}$ is a second quadrature input signal including a frequency higher than a baseband frequency and t is time. The second quadrature input signals both include a first signal and a second signal, where the second signal includes a frequency of the included first signal and a 90-degree phase relationship with the included first signal.

Similarly, an output signal using multiple quadrature phases of the LO (local oscillator) signal can be generated:

$$\cos(\omega_{LO1}+\omega_{LO2}+\omega_{BB})t = \cos(\omega_{LO1}t)\cos(\omega_{LO2}t)\cos(\omega_{BB}t) - \sin(\omega_{LO1}t)\sin(\omega_{LO2}t)\cos(\omega_{BB}t) - \sin(\omega_{LO1}t)\cos(\omega_{LO2}t)\sin(\omega_{BB}t) - \cos(\omega_{LO1}t)\sin(\omega_{LO2}t)\sin(\omega_{BB}t) \quad \text{(Eq. 2)}$$

where $\omega_{LO1}$ and $\omega_{LO2}$ are second and third quadrature input signals, each including a frequency higher than a baseband frequency. The canonic forms of single-sideband combinations of quadrature phases at each of the constituent signals of (Eq. 1) and (Eq. 2) set forth hereinabove can be extended to generate an output in quadrature centered at two, three, or more frequencies. In an example, up-conversion mixers can be arranged to operate responsive to the second and third quadrature input signals from a pair of local oscillators (e.g., LO1 and LO2) in an additive manner to generate an output signal higher in frequency than either of the frequencies of the LO1 and LO2 oscillators.

Realization of quadrature generation at RF frequency can be relatively costly in terms of power, area, and signal loss. Some linear phase shifters include "lossy" passive components (e.g. inductor and capacitors). When phase shifters include passive components (e.g., as compared to including active components for amplification), the passive phase shifters introduce signal loss, which degrades the signal to noise ratio (SNR) of the phase-shifted signal, while the passive components occupy a relatively large footprint of the phase shifter circuitry. Quadrature generation at the LO frequencies can also include "power-hungry" frequency dividers and multipliers and/or cross-coupled VCOs (voltage controlled oscillators), which consume relatively large amounts of current.

Quadrature generation in signal flow described hereinbelow includes coupling the input signal to the two separate phase shifter elements (e.g., arranged in accordance with a "lead-lag" architecture described hereinbelow) for generating a quadrature phase shift in the signal path. The differential signals are arranged as a low loss network, which helps avoid SNR degradation.

As described hereinbelow, a low power quadrature phase shifter includes one or more input transistors for receiving input frequencies for modulating drain currents of two cascode source-coupled transistors. Passive reactive two passive elements each coupled to the gate or base terminals of the cascode transistors for phase shifting first and second cascode transistors output current in accordance with a difference between two (e.g., selectable) gate impedances for generating gate voltages substantially quadrature in phase.

For example, an input (e.g., tail) transistor generates a (e.g., tail) current in response to a first input voltage signal (e.g., an RF signal). The tail current is coupled to (e.g., source) terminals of the cascode transistors, which are arranged in parallel between a first power supply and ground. The amount of phase shift is selectively controlled by adjusting parameters of the passive components coupled to the gate (or base) terminals of the transistors. The output currents controlled by the passive components can be weighted using selectable scalar quantities. The output currents can be vector modulated, up- or down-converted, or conveyed as single-ended or differential signals. Noise from the quadrature phase generating passive components can be degenerated using the high output impedance of the input transistor, which reduces noise otherwise present in phase shifting operations.

FIG. 1A is a schematic diagram of an example down-converting RF phase shifter mixer architecture in accordance with the description herein. Quadrature down-conversion mixer 100 includes a first-frequency (e.g., RF) modulation input transistor 101 for converting a first input signal to a first-frequency modulated current. For example, the first-frequency modulation input transistor 101 is arranged to modulate an input RF frequency $f_{RF,0}$ to generate an RF-modulated (e.g., tail) current.

The first-frequency modulation input transistor 101 can optionally be implemented as two separate transistors (e.g., 401-A and 401-B of FIG. 4) including respective control terminals (e.g., gates or bases) coupled to the first input signal, and each separate transistor including current terminals (e.g., emitter/collector or sources/drains) for carrying a modulated current coupled to a respective phase generator differential amplifier 110-A and 110-B.

The RF-modulated current carried by the first-frequency modulation input transistor 101 is coupled to respective emitter terminals of phasing transistors 102-A and 102-B such that the RF-modulated tail current is divided into first and second split RF-modulated currents, each of which is controlled by a respective one of the phasing (e.g., phase shifting) transistors 102-A and 102-B. In various implementations, the example NPN phasing transistors 102-A and 102-B can be replaced by NMOS transistors 102-A and 102-B while PNP transistors can be replaced with PMOS transistors. The base terminals of 102-A and 102-B are coupled to impedances 103-A ($Z_1$) and 103-B ($Z_2$) for selectively phase shifting a respective first and second RF-modulated current.

The phase relationship (e.g., generated by a phase shift) between the in-phase phase-shifted first-frequency modulated current (e.g., coupled from the 102-A collector) differs from the quadrature phase-shifted first-frequency modulated current (e.g., coupled from the 102-B collector) by a target phase difference of 90 degrees. For example, the phasing transistor 102-A generates a selected leading phase delay (in response to impedance 103-A), which leads a selected lagging phase delay generated by phasing transistor 102-B, (generated in response to impedance 103-B). Exactly one of the selected leading phase delay and the selected lagging phase delay can have a value of zero, for example. Accordingly, the phasing transistor 102-A generates a first phase-shifted RF-modulated current, whereas the phasing transistor 102-B generates a second phase-shifted RF-modulated current.

The first and second phase-shifted RF-modulated currents are each coupled from a respective collector of phasing transistors 102-A and 102-B to an inductor (such as the respective inductor networks 104-A and 104-B). The inductor network 104-A or 104-B, for example, can be a differential-to-single-ended conversion transformer such as a balun. The inductor network 104-A is arranged for converting the first phase-shifted RF-modulated current to a differential voltage developed across a first inductor (e.g., the primary coil of 104-A), where the differential voltage is inductively coupled to a second inductor (e.g., the secondary coil of 104-A, which includes a center tap coupled to ground).

In a similar manner, the inductor network 104-B is arranged for converting the second phase-shifted RF-modulated current to a differential voltage developed across a first inductor (e.g., the primary coil of 104-A), where the differential voltage is inductively coupled to a second inductor (e.g., the secondary coil of 104-B, which includes a center tap coupled to ground). Accordingly, the inductor network 104-A generates a first phase-shifted RF-modulated differential voltage, whereas the inductor network 104-B generates a second phase-shifted RF-modulated differential voltage.

In an implementation, the inductor networks 104-A and 104-B are transformers for coupling power such that a first power domain can optionally be isolated from a second power domain. For example, the first power domain $V_{DD}$ (e.g., for powering the phase generator differential amplifiers 110-A and 110-B) is galvanically isolated from a second power domain $V_{DC}$ (e.g., for supplying power to passive components for generating impedances $Z_1$ and $Z_2$). Isolation of the power domains, for example, facilitates the use of low-voltage (e.g., of only around two PN junction voltage thresholds) power supplies and reduces electrical noise. Because the passive networks $Z_1$ and $Z_2$ are respectively coupled to the control (e.g., base or gate) terminal of phasing transistors 102-A and 102-B, electrical noise resulting from $Z_1$ and $Z_2$ is degenerated by the output impedance of first-frequency modulation input transistor 101, such that the noise is substantially reduced from the output nodes before being coupled to the inputs of the baseband stages.

The first phase-shifted RF-modulated differential voltages output from the secondary coil of transformer network 104-A are respectively coupled to the emitter terminals (or alternatively, the source terminals) of the second-frequency modulation input transistors 105-A and 105-B, while the second phase-shifted RF-modulated differential voltage output from the secondary coil of transformer network 104-B are respectively coupled to the emitter (or source) terminals of the second-frequency modulation input transistors 105-C and 105-D. The second-frequency modulation input transistors 105-A and 105-B modulate the first phase-shifted RF-modulated differential voltages in response to a first phase of a first differential LO1 (first local oscillator) signal, while the second-frequency modulation input transistors 105-C and 105-D modulate the second phase-shifted RF-modulated differential voltages in response to a second phase (opposite to the first phase) of the first differential LO signal. Accordingly, the (e.g., selected instances of) second-frequency modulation input transistors 105-A are for generating a positive in-phase baseband signal (BBIP), the (e.g., selected instances of) second-frequency modulation input transistors 105-B are for generating a negative in-phase baseband signal (BBIM), the (e.g., selected instances of) second-frequency modulation input transistors 105-C are for generating a positive quadrature baseband signal (BBQP in quadrature with BBIP), and the (e.g., selected instances of) second-frequency modulation input transistors 105-D are for generating a negative quadrature baseband signal (BBQM in quadrature with BBIM).

A first LO1 in-phase modulator includes an array of paralleled instances 109-A, where each instance 109-A includes a pair of second-frequency modulation input transistors 105-A and 105-B, each of which is coupled in series with a respective one of the switches (e.g., transistors) 106-A and 106-B. Each such instance 109-A of the first LO1 in-phase modulator can be individually selected (e.g., together with or apart from other such instance pairs) in response to the configuration signal (which closes the switches 106-A and 106-B for each such selected instance 109-A pair). Each such selected instance 109-A of the first LO1 in-phase modulator carries a portion of the entire current of the first LO1 in-phase modulator in parallel.

A first number of M instances out of N instances 109-A including a first pair of switches 106-A and 106-B—as well as second number of M instances out of N instances of 109-B including a second pair of switches 106-C and 106-D—are determined for adjusting current phases as described hereinbelow. The first pair of switches 106-A and 106-B and a second pair of switches 106-C and 106-D can each be implemented as a parallel array N switchable transistors, in which a first number M (M1) of switches 106-A and 106-B and a second number M (M2) of switches 106-C and 106-D are programmed to be ON (e.g., closed) while the remainder of the (e.g., N-M1 and N-M2) switches are programmed to be (and/or remain) OFF (e.g., open).

Accordingly, the switches 106-A and 106-B (as well as the switches 106-C and 106-D) are each instantiated as selectable instances 109-A (and 109-B), where each such selectable instance is for coupling/decoupling (e.g., source-to-drain or emitter-to-collector) current to or from an associated segmented transistor (e.g., paralleled transistors including a common control terminal). Enabling M such switches from an array of total N switches (where M<N), can be used to correct quadrature phasing inaccuracies. In cases where the currents are in quadrature, a number M of selected instances of switches 106-A and 106-B (as well as the switches 106-C and 106-D) can generate a selected scalar change (e.g., generate a variable gain) for programmatically changing the output current to a load.

For example, the current drive strength of the first LO1 in-phase modulator can be determined in response to the sum of the currents of the selected instances 109-A of the second-frequency modulation input transistors 105-A and 105-B. The selected instances 109-A of the paralleled second-frequency modulation input transistors 105-A and 105-B can have differing sized channels and/or transconductances, for example, such that the current drive strength can be selected in accordance with quanta in accordance with a logarithmic scale. The current drive strength of the second LO1 quadrature modulator can be similarly configured by closing selected instances 109-B of switches 106-C and 106-D, which selects one or more respective instances of the second-frequency modulation input transistors 105-C and 105-D.

The output currents (e.g., BBIP and BBIM) of the switches 106-A and 106-B are coupled to an output load network including the biasing resistors 107-A and 107-B and the pull-up transistors 108-A and 108-B. In a similar manner, the currents (e.g., BBQP and BBQM) of the switches 106-C and 106-D are coupled to an output load network including the biasing resistors 107-C and 107-D and the pull-up transistors 108-C and 108-D. The voltage gain of transistors 108-A and 108-B is developed in response to the output currents BBIP and BBIM coupled to the biasing resistors 107-A and 107-B, whereas the voltage gain of transistors 108-C and 108-D is developed in response to the output currents BBQP and BBQM coupled to the biasing resistors 107-C and 107-D.

The output nodes (e.g., the BBIP, BBIM, BBQP, and BBQM quadrature LO signals) from the biasing resistors 107-A, 107-B, 107-C, and 107-D are coupled to inputs of baseband stages. Such coupling is described herein below with respect to FIG. 8 and with respect to U.S. patent application Ser. No. 15/488,434 (filed Apr. 14, 2017), which is incorporated herein by reference in its entirety and for all purposes. For example, the integration of the mixers 100, 200, 300, 400, 500, 600, and 700 described herein as up-converting or down-converting mixers of the transmitter, receiver, and transceiver systems described in the incorporated reference are contemplated.

As discussed hereinbelow, the phasing of the first inductively generated phase-shifted RF-modulated differential voltage is generated in response to the (e.g., first) current drive strength of the selected instances 109-A of the first LO1 in-phase modulator, whereas the phasing of the secondly inductively generated phase-shifted RF-modulated differential voltage is generated in response to the (e.g., second) current drive strength of the selected instances 109-B of the second LO1 quadrature modulator. The selectable phasing of the selected instances 109-A and 109-B of the first and second LO1 modulators can selectively compensate for (e.g., relatively minor) tolerance errors resulting from the passive components for generating impedances $Z_1$ and $Z_2$, for example.

The switches 106-A and 106-B of the selected instances 109-A are selectively closed in accordance with scaling factors in order to implement more accurate quadrature phasing (e.g., when the output currents from respective phasing transistors 102-A and 102-B are not entirely in quadrature due to the manufactured characteristics of $Z_1$ and/or $Z_2$). The "configure" signal can be a digitally configurable signal (e.g., configurable in response to one or more of jumpers, fuses, manually operated switches, a control program executing upon a processor such as DSP 801, and logic hardware) for coupling currents from selected instances 109-A of the first LO1 in-phase modulator. The scaling factors can be determined in response to operating characteristics (for example by measuring signal quality during operation). The "configure" signal is asserted to select the particular instances 109-A for generating a particular determined scalar factor. The "configure" signal is asserted in a similar manner for selecting the particular instances 109-B for generating a particular determined scalar factor.

Figure 1B:
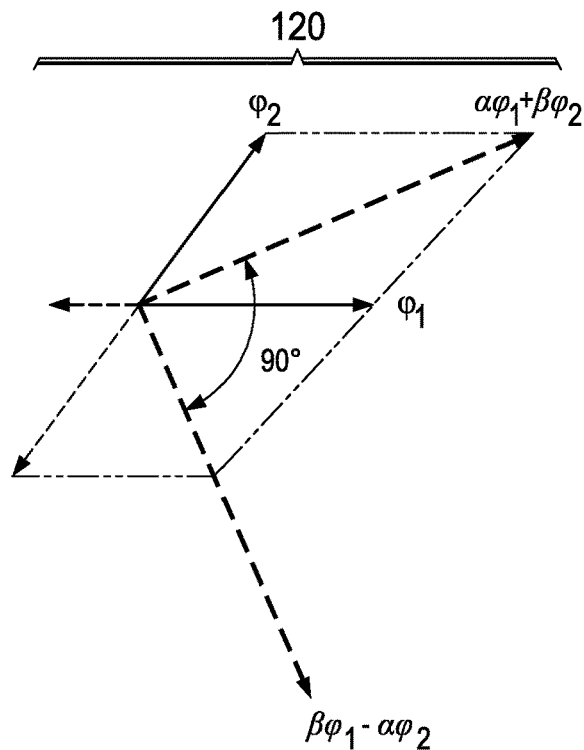
FIG. 1B is a current phasor vector diagram of an example RF phase shifter mixer architecture in accordance with the description herein.

FIG. 1B is a current phasor vector diagram of an example RF phase shifter mixer architecture in accordance with the description herein. In an implementation in which the components of each instance 109-A and 109-B of the first and second LO1 modulators include similar (e.g., equal) electrical characteristics, an appropriate number of switches can be close in accordance with:

$$\psi_1 = \alpha\phi_1 + \beta\phi_2$$

$$\psi_2 = \beta\phi_1 - \alpha\phi_2 \quad\quad\quad (\text{Eq. 3})$$

where (for example) $\psi_1$ is the total current flowing from second-frequency modulation input transistors 105-A and 105-B, $\psi_2$ is the total current flowing from second-frequency modulation input transistors 105-C and 105-D, the scalars $\alpha$ and $\beta$ include programmatically selectable scalar values, the phase $\phi_1$ is associated with the phase of phasing transistor 102-A being phase shifted in accordance with impedance 103-A ($Z_1$), and the phase $\phi_2$ is associated with the phase of phasing transistor 102-B being phase shifted in accordance with impedance 103-B ($Z_2$).

As shown in current phasor vectors 120, the current phasor vectors $\psi_1$ and $\psi_2$ are oriented 90 degrees apart. Accordingly, orthogonal vectors $\psi_1$ and $\psi_2$ are generated in response to two different phases of the first phase-shifted RF-modulated current and the second phase-shifted RF-modulated current, in response to a scalar multiplication, and in response to an addition (or subtraction) operation (in accordance with Eq. 3 described hereinabove).

Respectively adjusting the values of the scalars $\alpha$ and $\beta$ (e.g., as described in Eq. 3 hereinabove) adjusts the degree of orthogonality of the current phasor vectors $\psi_1$ and $\psi_2$. For example, the angle between the current phasor vectors $\psi_1$ and $\psi_2$ can be adjusted (e.g., in accordance with the scalars $\alpha$ and $\beta$) to compensate for phase inaccuracies caused by tolerances in the phase shift generation (e.g., resulting from component variations of components of $Z_1$ and $Z_2$).

With reference again to FIG. 1A, the quadrature down-conversion mixer is an example dual-balanced mixer arranged for receiving an input RF signal as a first-frequency for modulating respective control currents, each such current being coupled to a respective phase shifter network (e.g., a first network including phasing transistor 102-A coupled to impedance $Z_1$ 103-A and a second network including transistor 102-B coupled to impedance $Z_2$ 103-B). Accordingly, first and second phase-shifted first-frequency modulated currents are generated thereby.

The first and second phase-shifted first-frequency modulated currents are respectively modulated by an input LO signal (which is a second-frequency, which is lower than the first-frequency of the input RF signal coupled to the control terminal of the first-frequency modulation input transistor 101) to generate first and second output signals. For example, each of the first and second output signals is RF-modulated, phase-shifted, and LO-modulated.

Each of the first and second output signals is coupled to a respective load network. For example, a first load network includes the biasing resistors 107-A and 107-B and the pull-up transistors 108-A and 108-B, while a second load network includes the biasing resistors 107-C and 107-D and the pull-up transistors 108-C and 108-D.

Each of the first and second load networks is arranged to generate a respective voltage in response to the respectively coupled first and second output signals. For example, a first output voltage differential is generated at the drain of the first load network (which includes the biasing resistors 107-A and 107-B and the pull-up transistors 108-A and 108-B), while a second output voltage differential is generated at the drain of a second load network (which includes the biasing resistors 107-C and 107-D and the pull-up transistors 108-C and 108-D). Accordingly, the first and second output signals respectively include the first and second output voltage differentials.

Additionally, the first and second output signals are generated at the source terminals of the selected instances 109-A and 109-B respectively of the LO switching transistors 106-A, 106-B, 106-C, and 106-D (e.g., as the differential baseband input signals BBIP, BBIM, BBQP, and BBQM). The addition (and subtraction) of RF-modulated output currents in accordance with the current phasor vectors $\psi_1$ and $\psi_2$ can compensate for the (e.g., slight) losses incurred by (e.g., passive components of) the phase shifter networks, such that a corrected phase shift of 90 degrees is generated (e.g., as described in Eq. 3 hereinabove).

Accordingly, the quadrature down-conversion mixer 100 is arranged to generate baseband input signals as differential quadrature LO signals, which can facilitate a substantial power saving and lower device latency in an overall architecture including the quadrature down-conversion mixer 100.

Figure 1C:
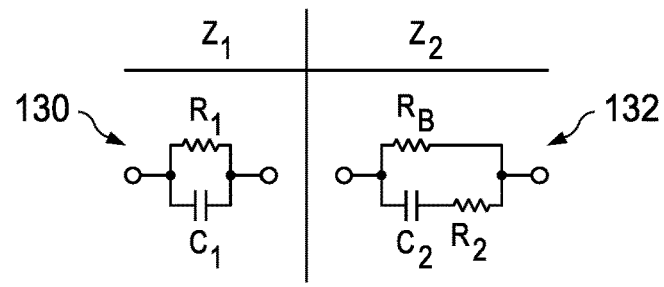
FIG. 1C is a schematic diagram of a first example of the $Z_1$ and $Z_2$ networks of FIG. 1A.

FIG. 1C is a schematic diagram of a first example of the $Z_1$ and $Z_2$ networks of FIG. 1A. For example, the $Z_1$ network 130 is an impedance such as impedance 103-A, and the $Z_2$ network 132 is an impedance such as impedance 103-B. The $Z_1$ network 130 includes a first resistor $R_1$ and a first capacitor $C_1$ in parallel, while the $Z_2$ network 132 includes a biasing resistor $R_B$ in parallel with a series combination of a second capacitor $C_2$ and a second resistor $R_2$.

In operation, the $Z_1$ and $Z_2$ networks generate a DC biasing voltage for biasing the control terminal (the base of a bipolar transistor or the gate of a MOSFET transistor) for phasing transistors 102-A and 102-B. The networks $Z_1$ and $Z_2$ also generate an AC biasing voltage for biasing the respective control terminals (e.g., which is AC-coupled via gate-source or base-emitter capacitances 111-A and 111-B) of transistors 102-A and 102-B. Such capacitances can be inherent (e.g., capacitances resulting from parasitic structures of the transistors 102-A and 102-B) or extrinsic (e.g., capacitances resulting from capacitive structures coupled between the gate-source or base-emitter terminals of the transistors 102-A and 102-B).

The AC and DC components of the biasing voltage generate separate lead-lag phase shifts of each of the currents carried by the transistors 102-A and 102-B. For example, when the first impedance (e.g., network $Z_1$) is for generating a phase lead, the second impedance (e.g., network $Z_2$) is for generating a phase lag. Likewise, when the first impedance is for generating a phase lag, the second impedance is for generating a phase lead. The sum of the phase lag and lead is 90 degrees, by which output signals in quadrature can be generated.

For example, the $Z_1$ network 130 is arranged to lead the $Z_2$ network 132 (and the $Z_2$ network 132 is arranged to lag the $Z_1$ network 130). Assuming the biasing resistor $R_B$ to be very large (e.g., with respect to resistor $R_2$), the magnitude of the in-phase current $i_1$ (e.g., which is for driving the respective phase generator differential amplifier 110-A) and the magnitude of the quadrature current $i_2$ (e.g., which is for driving the respective phase generator differential amplifier 110-B) are:

$$i_I = \alpha i_{out1} + \beta i_{out2}$$

$$i_Q = \beta i_{out2} - \alpha i_{out1} \qquad \text{(Eq. 4)}$$

For an impedance Z, connected to the gate of MOS transistor, the output current (e.g. drain current) is:

$$i_{out} = \left[\frac{g_m}{1+j\omega C_{GS}Z} + \frac{1}{r_O}\right]v_{in} \qquad \text{(Eq. 5)}$$

where $g_m$ is the transconductance of the MOS transistor, $C_{GS}$ is the gate-to-source capacitance of the MOS transistor, and $r_o$ is the on-resistance of the MOS transistor.

The product of the on-resistance (e.g., in Ohms) and the transconductance (e.g., in Siemens or "mhos") can be around 10 (e.g., even in scaled MOS technologies), such that the reciprocal of the on-resistance can be ignored, and such that the output current of the MOS transistor can be expressed as:

$$i_{out} = \left[\frac{g_m}{1+j\omega C_{GS}Z}\right]v_{in} \qquad \text{(Eq. 6)}$$

For the $Z_1$ network 130:

$$Z_1 = \left[\frac{R_1}{1+j\omega C_1 R_1}\right] \qquad \text{(Eq. 7)}$$

such that the magnitude $i_{out1}$ of the output current of the first MOS transistor 102-A (assuming, for example, the transistor 102 is a MOS transistor) is:

$$i_{out1} = g_m \left[\frac{(1+j\omega C_1 R_1)}{1+j\omega(C_{GS}+C_1)R_1}\right]v_{in}, \qquad \text{(Eq. 8)}$$

and the phase $\varphi_1$ of the output current of the first MOS transistor 102-A is:

$$\varphi_1 = \tan^{-1}(\omega C_1 R_1) - \tan^{-1}[\omega(C_{GS}+C_1)R_1] \qquad \text{(Eq. 9)}$$

For the $Z_2$ network 132:

$$Z_2 = R_2 + \frac{1}{j\omega C_2} \quad \text{(Eq. 10)}$$

such that the magnitude $i_{out2}$ of the output current of the second MOS transistor 102-B is:

$$i_{out2} = \frac{g_m}{\left(1 + \frac{C_{GS}}{C_2}\right)}\left[\frac{1}{1 + j\omega(C_{GS}\|C_2)}\right] v_{in} \quad \text{(Eq. 11)}$$

and the phase $\varphi_2$ of the output current of the second MOS transistor 102-B is:

$$\varphi_2 = -\tan^{-1}[\omega(C_{GS}\|C_2)_2] \quad \text{(Eq. 12)}$$

Figure 1D:
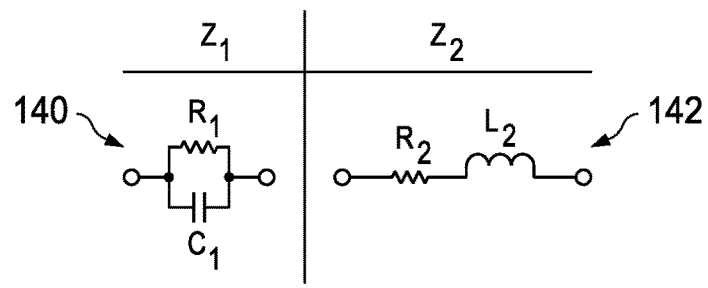
FIG. 1D is a schematic diagram of a second example of the $Z_1$ and $Z_2$ networks of FIG. 1A.

FIG. 1D is a schematic diagram of a second example of the $Z_1$ and $Z_2$ networks of FIG. 1A. For example, the $Z_1$ network 140 is an impedance such as impedance 103-A, and the $Z_2$ network 142 is an impedance such as impedance 103-B. The $Z_1$ network 140 includes a first resistor $R_1$ and a first capacitor $C_1$ in parallel, while the $Z_2$ network 132 includes a second resistor $R_2$ in series with an inductor $L_1$.

The $Z_1$ network 140 includes characteristics of the example $Z_1$ network 130 described hereinabove with reference to FIG. 1C.

For the $Z_2$ network 142, the phase shift phase $\varphi_2$ of the output current of the second MOS transistor 102-B is:

$$\varphi_2 = -\tan^{-1}\left[\frac{\omega C_{GS} R_2}{1 - \omega^2 C_{GS} L_2}\right] \quad \text{(Eq. 13)}$$

To generate a quadrature phase shift between $Z_1$ network 140 and $Z_2$ network 142, $\varphi_1$ and $\varphi_2$ are to be separated by a phase angle of 90 degrees. Likewise, to generate a quadrature phase shift between $Z_1$ network 130 and $Z_2$ network 132, $\varphi_1$ and $\varphi_2$ are also to be separated by a phase angle of 90 degrees.

For example, when $C_1 \gg C_{GS}$, $C_2 \gg C_{GS}$, $\omega^2 C_{GS} L_2 = 1$, and $\omega C_{GS} R_2 \approx 10$, $\varphi_1$ is a phase angle around 0 degrees and $\varphi_2$ is a phase angle around −85 degrees. Accordingly, the phase difference between $\varphi_1$ and $\varphi_2$ includes a phase angle error around 5 degrees (with respect to true quadrature). The phase-angle error of around 5 degrees is a phase angle correctable by controlling the selection of particular instances 109-A and 109-B as described hereinabove.

In examples, the phase difference is correctable by controlling the selection of particular instances 109-A and 109-B. Further, capacitors for generating capacitances $C_1$ and $C_2$ can be selectively coupled in parallel (and/or series) using digital controls for correcting (e.g., a portion of the) phase differences. Accordingly, the effects of process variations contributing to phase differences errors can be reduced by selectively coupling selected capacitors for generating the (e.g., ideal) capacitances $C_1$ and $C_2$ (which are coupled to the control terminal of phasing transistors 102-A and 102-B, for example).

In examples, the phasing transistors 102-A and 102-B can each be arranged as parallel transistors so as to provide a variable gain functionality. The phasing transistors 102-A and 102-B can have digitally controlled switches for selecting paralleled branches of each such paralleled phasing transistor 102-A and 102-B. Accordingly, each of the phasing transistors 102-A and 102-B can be implemented as a number N of multiple paralleled transistors, where any number of zero through N paralleled transistors are activated by using digital control for opening or closing selected branches of the paralleled transistors.

Figure 2:
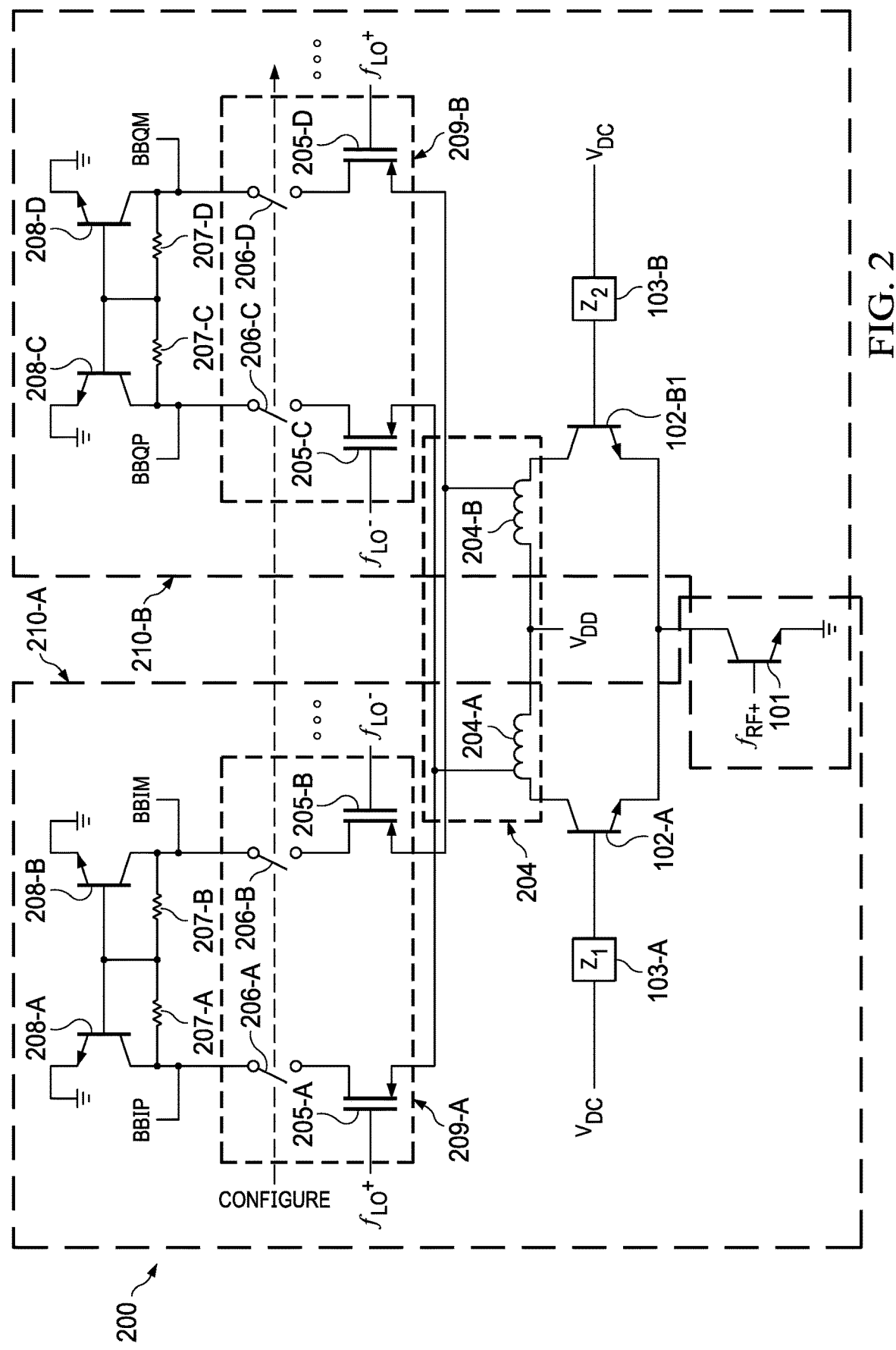
FIG. 2 is a schematic diagram of an example down-converting autotransformer-coupled low voltage RF phase shifter mixer architecture in accordance with the description herein.

FIG. 2 is a schematic diagram of an example down-converting autotransformer-coupled low voltage RF phase shifter mixer architecture in accordance with the description herein. For example, quadrature down-conversion mixer 200 includes a first-frequency modulation input transistor 101 for converting a first input signal to a first modulated current. The first modulated current is bifurcated into an in-phase current (e.g., which flows through phase generator differential amplifier 210-A) and quadrature current (e.g., which flows through phase generator differential amplifier 210-B).

The bifurcated first modulated current is coupled through respective phase-shifting transistors 102-A and 102-B for biasing in response to respective impedance networks 103-A and 103-B to generate first and second phase-shifted first-modulated currents. The impedance networks 103-A and 103-B respectively can include resistive devices (resistors for DC impedance) and/or reactive devices (e.g., capacitors and/or inductors for AC impedance) selectably arranged in a switching matrix for programmatically selecting a desired impedance for coupling to a respective impedance network 103-A and 103-B. As discussed herein, the respective impedance networks 103-A and 103-B are for generating in-phase and quadrature signals.

The first and second phase-shifted first-modulated currents are generated in quadrature (e.g., with respect to a phase difference therebetween) or are correctably close to quadrature (e.g., by selectively coupling instances 209-A and 209-B, described hereinbelow). The first and second phase-shifted first-modulated currents are coupled respectively to the inductor network 204 for single-ended to differential coupling.

The inductor network 204 autotransformer includes a center tap (between 204-A and 204-B) coupled to $V_{DD}$ such that (e.g., conventional) current flows from the inductor network 204 through the selected instances 209-A and 209-B. The current sourced from the inductor network 204 center tap flows in a first paralleled path (e.g., through the phase generator differential amplifiers 210-A and 210-B) towards the biasing resistors 207-A, 207-B, 207-C, and 207-D and the pull-up transistors 208-A, 208-B, 208-C, and 208-D. The current sourced through the inductor network 204 center tap also flows in a second paralleled path towards the first-frequency modulation input transistor 101 and the phase-shifting transistors 102-A and 102-B.

The first and second phase-shifted first-modulated currents are correctably close to quadrature when the phase difference between the first and second phase-shifted first-modulated currents can be changed to 90 degrees by selectively coupling instances 209-A and 209-B. The selectable changes in the current path through the selected instances of 209-A and 209-B can incrementally change (e.g., scale) the instantaneous current through the respective inductor networks 204-A and 204-B (e.g., such that selected phase shifts for correcting a phase difference therebetween can be generated by each inductor network 204-A and 204-B).

Each selectable instance 209-A includes second-frequency (e.g., LO) modulation input transistors 205-A and 205-B, and each selectable instance 209-B includes second-frequency modulation input transistors 205-C and 205-D. The second-frequency modulation input transistors 205-A and 205-D are coupled to a first phase of a (e.g., LO) second-frequency input signal, whereas the second frequency modulation input transistors 205-B and 205-C are coupled to a second phase of (e.g., 180 degrees opposite to the first phase) of the second-frequency input signal.

The currents output by second-frequency modulation input transistors 205-A, 205-B, 205-C, and 205-D are scaled by closing respective switches 206-A, 206-B, 206-C, and 206-D (e.g., by selectively coupling selected instances 209-A and 209-B). Scaling the output currents of second-frequency modulation input transistors 205-A, 205-B, 205-C, and 205-D changes (and, e.g., corrects for) phase errors in quadrature.

The scaled output currents of the second-frequency modulation input transistors 205-A, 205-B, 205-C, and 205-D are converted to respective baseband voltages by respective pull-up load networks coupled between the drain and the gate (or collector and base) of commonly biased transistors. For example, a first pull-up load network generates the output signals BBIP and BBIM and includes commonly biased transistors 208-A and 208-B and biasing resistors 207-A and 207-B, while a second pull-up load network generates the output signals BBQP and BBQM and includes commonly biased transistors 208-C and 208-D and biasing resistors 207-C and 207-D.

The phase generator differential amplifiers 210-A and 210-B are each arranged as a folded cascode amplifier, which lowers the voltage for powering such circuits. The minimum supply voltage can be determine in accordance with $V_{PS}=V_T+2V_{ON}$, where $V_{PS}$ is the minimum supply voltage, $V_T$ is the threshold voltage of the differential amplifier transistors, and $V_{ON}$ is the overdrive voltage of the transistors. Accordingly, a single (e.g., and relatively low voltage) power supply voltage $V_{PS}$ can be coupled to the $V_{DD}$ input of the center tap of the inductor network 204.

The center tap of the inductor network 204 autotransformer is coupled to a DC voltage for energizing the primary and secondary windings (e.g., where a subset of the primary and secondary windings are mutually shared). A relatively high maximum quality factor can be achieved, for example, when a process technology for integrated circuit manufacture includes multiple metal layers, each of which can be coupled in parallel.

Accordingly, layout space and power consumption can be conserved in circuitry for generating the LO, for example, by generating the signals locally and moving the circuitry from the LO generation network.

Figure 3:
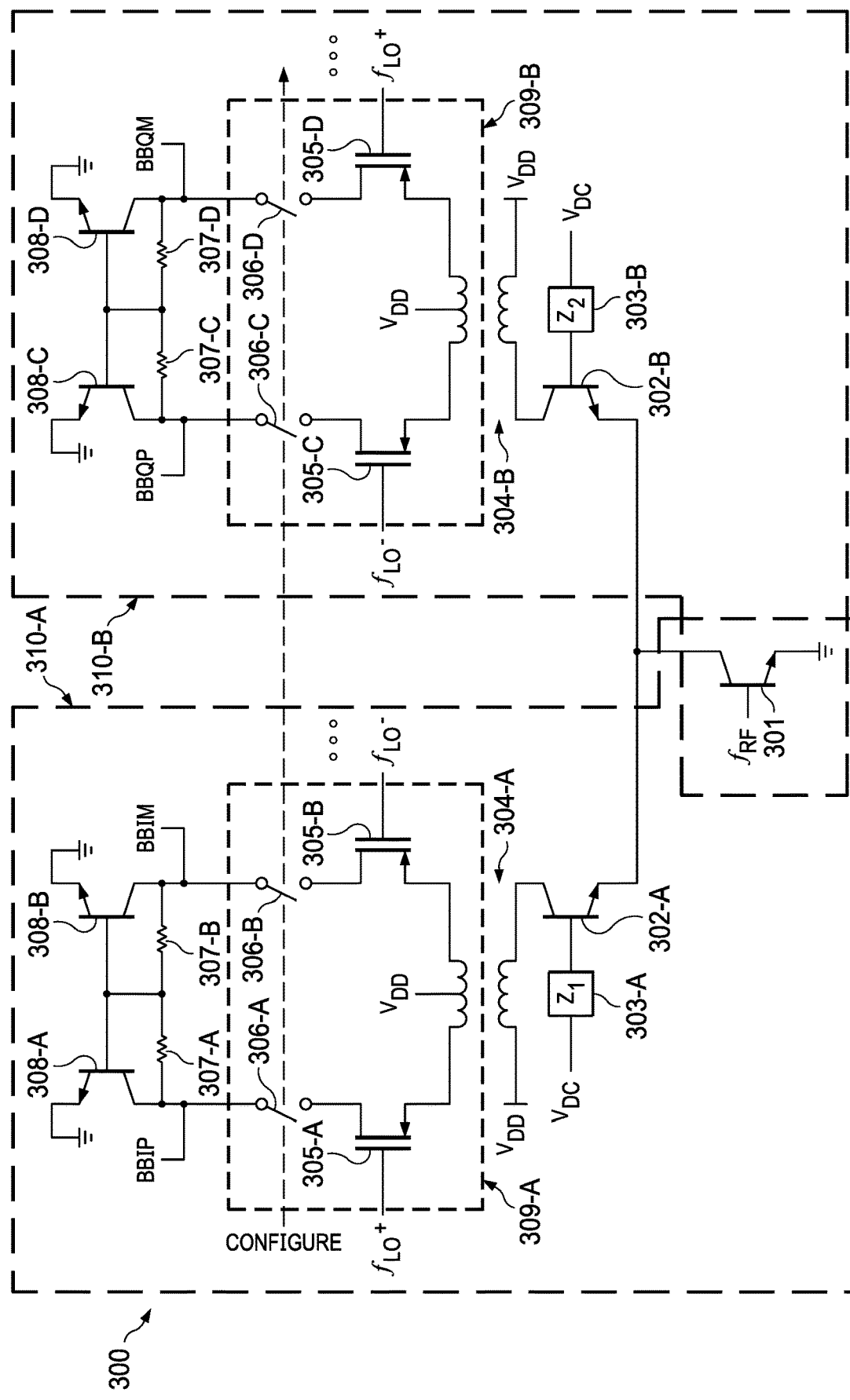
FIG. 3 is a schematic diagram of an example down-converting transformer-coupled low voltage RF phase shifter mixer architecture in accordance with the description herein.

FIG. 3 is a schematic diagram of an example down-converting transformer-coupled low voltage RF phase shifter mixer architecture in accordance with the description herein. For example, quadrature down-conversion mixer 300 includes a first-frequency modulation input transistor 301 for converting a first input signal to a first modulated current. The first modulated current is bifurcated into an in-phase current (e.g., which flows through phase generator differential amplifier 310-A) and quadrature current (e.g., which flows through phase generator differential amplifier 310-B).

The bifurcated first modulated current is coupled through respective phase-shifting transistors 302-A and 302-B for biasing in response to respective impedance networks 303-A and 303-B to generate first and second phase-shifted first-modulated currents. The impedance networks 303-A and 303-B respectively can include resistive devices and/or reactive devices selectably arranged in a switching matrix for programmatically selecting a desired impedance for coupling to a respective impedance network 303-A and 303-B. As discussed herein, the respective impedance networks 303-A and 303-B are for generating in-phase and quadrature signals.

The first and second phase-shifted first-modulated currents are generated in quadrature or are correctably close to quadrature. The first and second phase-shifted first-modulated currents are coupled respectively to the transformers 304-A and 304-B for single-ended to differential coupling.

The transformers 304-A and 304-B each include a center tap coupled to $V_{DD}$ such that (e.g., conventional) current flows from the inductor network 304 through the selected instances 309-A and 309-B. The currents sourced from the transformers 304-A and 304-B flows in a first paralleled path (e.g., through the phase generator differential amplifier 310-A) towards the biasing resistors 307-A, 307-B, 307-C, and 307-D and the pull-up transistors 308-A, 308-B, 308-C, and 308-D. The current sourced through the transformers 304-A and 304-B is inductively coupled from a first coil (e.g., a secondary coil of a magnetic transformer) to a second coil (e.g., a primary coil of the magnetic transformer) along a second paralleled path towards the first-frequency modulation input transistor 301 and the phase-shifting transistors 302-A and 302-B.

The first and second phase-shifted first-modulated currents are correctably close to quadrature when the phase difference between the first and second phase-shifted first-modulated currents can be changed to 90 degrees by selectively coupling instances 309-A and 309-B. The selectable changes in the current path through the selected instances of 309-A and 309-B can incrementally change the instantaneous current through the respective inductor networks 304-A and 304-B.

Each selectable instance 309-A includes second-frequency (e.g., LO) modulation input transistors 305-A and 305-B, and each selectable instance 309-B includes second-frequency modulation input transistors 305-C and 305-D. The second-frequency modulation input transistors 305-A and 305-D are coupled to a first phase of a (e.g., LO) second-frequency input signal, whereas the second frequency modulation input transistors 305-B and 305-C are coupled to a second phase of (e.g., 180 degrees opposite to the first phase) of the second-frequency input signal.

The currents output by second-frequency modulation input transistors 305-A, 305-B, 305-C, and 305-D are scaled by closing respective switches 306-A, 306-B, 306-C, and 306-D (e.g., by selectively coupling selected instances 309-A and 309-B). Scaling the output currents of second-frequency modulation input transistors 305-A, 305-B, 305-C, and 305-D changes (and, e.g., corrects for) phase errors in quadrature.

The scaled output currents of the second-frequency modulation input transistors 305-A, 305-B, 305-C, and 305-D are converted to respective baseband voltages by respective pull-up load networks coupled between the drain and the gate (or collector and base) of commonly biased transistors. For example, a first pull-up load network generates the output signals BBIP and BBIM and includes commonly biased transistors 308-A and 308-B and biasing resistors 307-A and 307-B, while a second pull-up load network generates the output signals BBQP and BBQM and includes commonly biased transistors 308-C and 308-D and biasing resistors 307-C and 307-D.

The phase generator differential amplifiers 310-A and 310-B are each arranged as a folded cascode amplifier, which lowers the voltage for powering such circuits. The minimum supply voltage can be determine in accordance with $V_{PS}=V_T+2V_{ON}$, where $V_{PS}$ is the minimum supply voltage, $V_T$ is the threshold voltage of the differential amplifier transistors, and $V_{ON}$ is the overdrive voltage of the transistors. Accordingly, a first power supply voltage $V_{PS}$ can be coupled to the $V_{DD}$ input of the center taps of the transformers 304-A and 304-B, whereas a second power supply voltage (e.g., independent from the first power supply voltage $V_{PS}$) can be coupled to the $V_{DC}$ input coupled to the control terminals of the respective phase-shifting transistors 302-A and 302-B.

Figure 4:
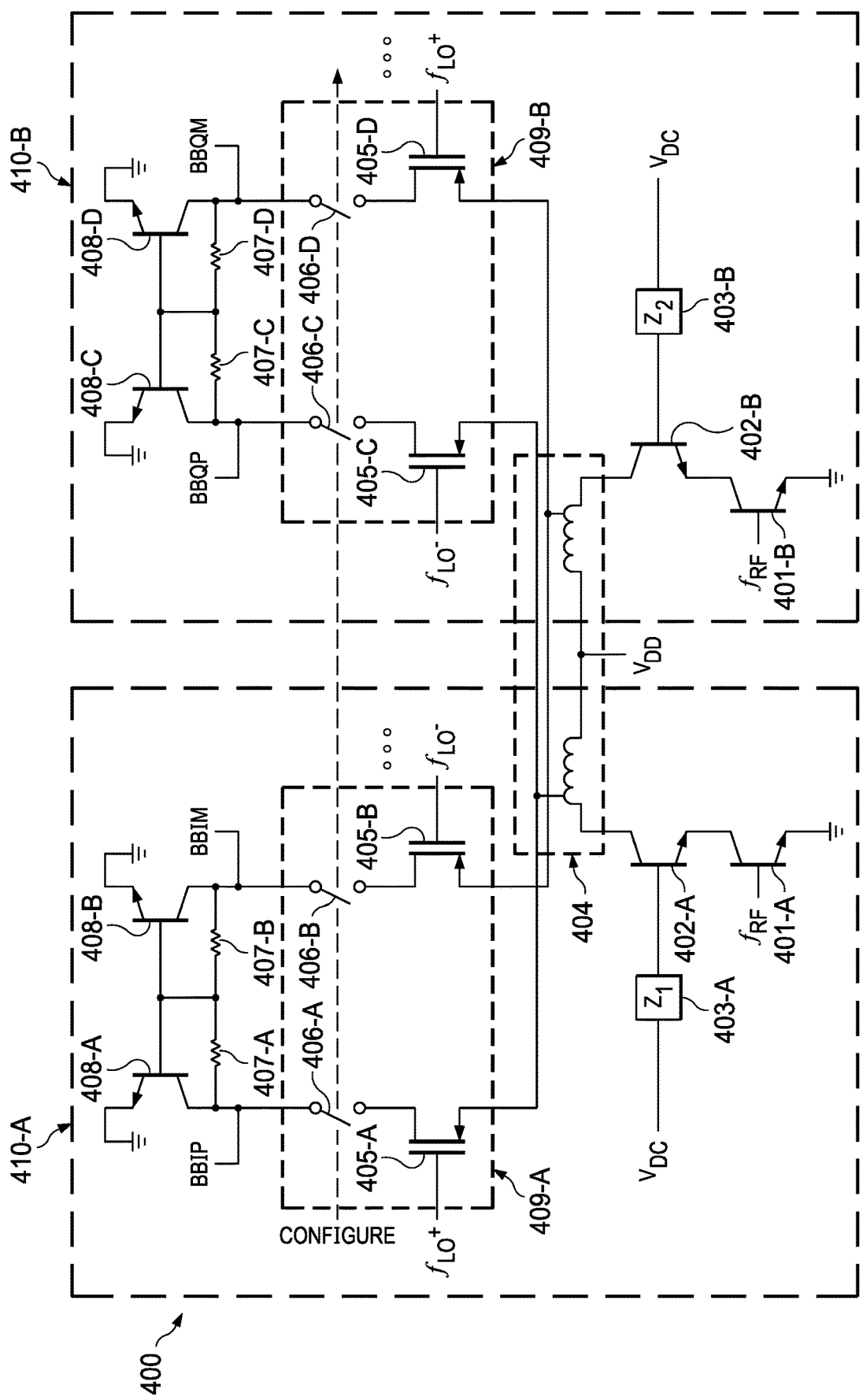
FIG. 4 is a schematic diagram of an example down-converting dual RF-transistor RF phase shifter mixer architecture in accordance with the description herein.

FIG. 4 is a schematic diagram of an example down-converting dual RF-transistor RF phase shifter mixer architecture in accordance with the description herein. For example, quadrature down-conversion mixer 400 includes a first-frequency modulation input transistor 401-A for converting a first input signal to a first modulated in-phase current (e.g., which flows through phase generator differential amplifier 410-A) and includes a first-frequency modulation input transistor 401-B for converting the first input signal to a first quadrature-phase current (e.g., which flows through differential amplifier 410-B).

The first in-phase and quadrature modulated currents are coupled through respective phase-shifting transistors 402-A and 402-B for biasing in response to respective impedance networks 403-A and 403-B to respectively generate first and second phase-shifted modulated currents. The impedance networks 403-A and 403-B respectively can include resistive devices and/or reactive devices selectably arranged in a switching matrix for programmatically selecting a desired impedance for coupling to a respective impedance network 403-A and 403-B. As discussed herein, the respective impedance networks 403-A and 403-B are for generating in-phase and quadrature signals.

The first and second phase-shifted first-modulated currents are generated in quadrature or are correctably close to quadrature. The first and second phase-shifted first-modulated currents are coupled respectively to the inductor network 404 for single-ended to differential coupling.

The inductor network 404 autotransformer (e.g., a single coil electrical transformer) includes a center tap coupled to $V_{DD}$ such that respective currents flow from the inductor network 404 through the selected instances 409-A and 409-B. The current sourced from the inductor network 404 center tap flows in a first paralleled path (e.g., through the phase generator differential amplifier 410-A) towards the biasing resistors 407-A, 407-B, 407-C, and 407-D and the pull-up transistors 408-A, 408-B, 408-C, and 408-D. The current sourced through the inductor network 404 center tap also flows along a second paralleled path towards the first-frequency modulation input transistor 401 and the phase-shifting transistors 402-A and 402-B.

The first and second phase-shifted first-modulated currents are correctably close to quadrature when the phase difference between the first and second phase-shifted first-modulated currents can be changed to 90 degrees by selectively coupling instances 409-A and 409-B. The selectable changes in the current path through the selected instances of 409-A and 409-B can incrementally change the instantaneous current through the respective inductor networks 404-A and 404-B.

Each selectable instance 409-A includes second-frequency (e.g., LO) modulation input transistors 405-A and 405-B, and each selectable instance 409-B includes second-frequency modulation input transistors 405-C and 405-D. The second-frequency modulation input transistors 405-A and 405-D are coupled to a first phase of a (e.g., LO) second-frequency input signal, whereas the second frequency modulation input transistors 405-B and 405-C are coupled to a second phase of (e.g., 180 degrees opposite to the first phase) of the second-frequency input signal.

The currents output by second-frequency modulation input transistors 405-A, 405-B, 405-C, and 405-D are scaled by closing respective switches 406-A, 406-B, 406-C, and 406-D (e.g., by selectively coupling selected instances 409-A and 409-B). Scaling the output currents second-frequency modulation input transistors 405-A, 405-B, 405-C, and 405-D changes (and, e.g., corrects for) phase errors in quadrature.

The scaled output currents of the second-frequency modulation input transistors 405-A, 405-B, 405-C, and 405-D are converted to respective baseband voltages by respective pull-up load networks coupled between the drain and the gate (or collector and base) of commonly biased transistors. For example, a first pull-up load network generates the output signals BBIP and BBIM and includes commonly biased transistors 408-A and 408-B and biasing resistors 407-A and 407-B, while a second pull-up load network generates the output signals BBQP and BBQM and includes commonly biased transistors 408-C and 408-D and biasing resistors 407-C and 407-D.

The phase generator differential amplifiers 410-A and 410-B are each arranged as a folded cascode amplifier, which lowers the voltage for powering such circuits. The minimum supply voltage can be determine in accordance with $V_{PS}=V_T+2V_{ON}$, where $V_{PS}$ is the minimum supply voltage, $V_T$ is the threshold voltage of the differential amplifier transistors, and $V_{ON}$ is the overdrive voltage of the transistors. Accordingly, a first power supply voltage $V_{PS}$ can be coupled to the $V_{DD}$ input of the center tap of the inductor network 404, whereas a second power supply voltage (e.g., independent from the first power supply voltage $V_{PS}$) can be coupled to the $V_{DC}$ input coupled to the control terminals of the respective phase-shifting transistors 402-A and 402-B.

The quadrature down-conversion mixers 100, 200, 300, 400 discussed herein with reference to FIGS. 1-4 can be used as down converting mixers. The quadrature down-conversion mixer input transistors (e.g., transistors 101, 301, or 401-A and 401-B) degenerate noise, which helps ensure proper characteristics of the output signals BBIP, BBIM, BBQP, and BBQM. The input RF signal (e.g., for controlling the quadrature down-conversion mixer input transistors) is single ended, which is a well suited for interfacing with a single ended antenna used in some RF systems.

In examples, the quadrature down-conversion mixers 100, 200, 300, 400 phasing transistors (e.g., 102-A and 102-B) can be arranged as parallel transistors so as to provide a variable gain functionality. The phasing transistors can have digitally controlled switches for selecting paralleled branches of each such paralleled phasing transistor. Accordingly, each of the phasing transistors can be implemented as a number N of multiple paralleled transistors, where any number of zero through N paralleled transistors are activated by using digital control for opening or closing selected branches of the paralleled transistors.

In examples, the quadrature down-conversion mixers 100, 200, 300, 400 second-frequency modulation input transistor pairs (e.g., pair 105-A and 105-B and pair 105-C and 105-D) are controlled by coupling second-frequency input signals from an LO generation path (not shown). In the examples, the output signals of the LO-frequency oscillator are arranged as differential signals, which reduces area and power consumption in the LO-frequency signal generation paths. Also, the LO-frequency oscillator can be directly coupled to the second-frequency modulation input transistor pairs, and which can save power by eliminating a buffer in the LO generation path.

In examples, the quadrature down-conversion mixers 100, 200, 300, 400 second-frequency modulation input transistor pairs (e.g., pair 105-A and 105-B and pair 105-C and 105-D) are arranged to switch the tail current (e.g., current carried by the quadrature down-conversion mixers 100, 200, 300, 400 RF first-frequency modulation input transistors (e.g., 101). In other examples, a voltage mode MOS switch can be used. The voltage mode switching is relatively free from flicker noise and switches with higher linearity. Accordingly, reduced switching noise and a higher dynamic range can be obtained for the same amount of power consumption as with current mode switching.

Figure 5:
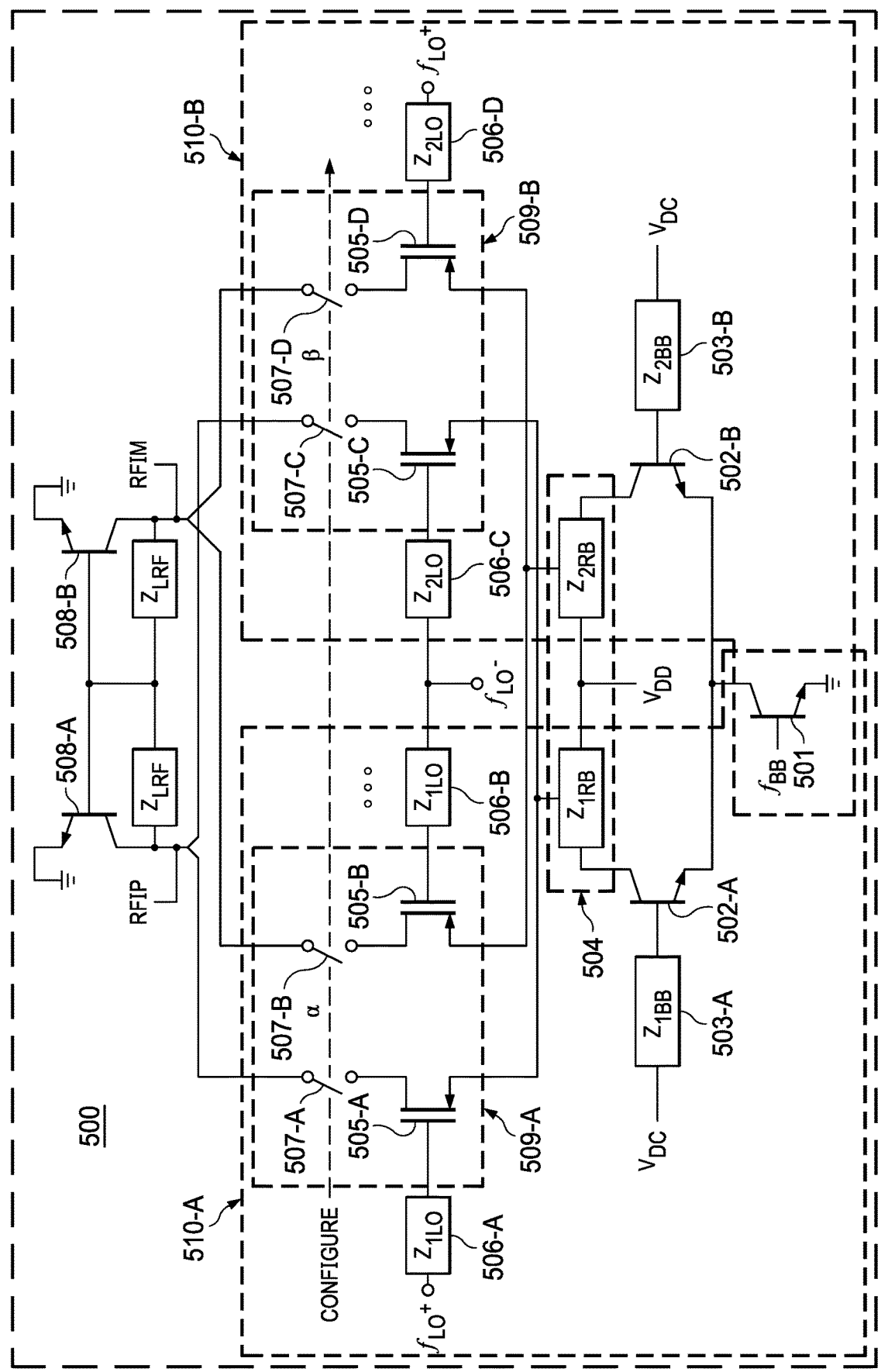
FIG. 5 is a schematic diagram of an example single LO-input up-converting phase shifter mixer architecture in accordance with the description herein.

FIG. 5 is a schematic diagram of an example single LO-input up-converting phase shifter mixer architecture in accordance with the description herein. For example, quadrature up-converting mixer 500 includes phase generator differential amplifiers 510-A and 510-B, each of which is arranged as a folded cascode amplifier, which lowers the operating voltage for saving power.

The quadrature up-converting mixer 500 includes a first-frequency (e.g., baseband) modulation input transistor 501 for converting a first input signal (e.g., $f_{BB}$) to a first first-frequency modulated current (e.g., which is for phase shifting in accordance with the impedance network 503-A) and to a second first-frequency modulated current (e.g., which is for phase shifting in accordance with the impedance network 503-B).

The first first-frequency modulated current is coupled through the phase-shifting transistor 502-A for biasing in response to the impedance ($Z_{1BB}$) network 503-A to generate a first phase-shifted first-modulated current. The second first-frequency modulate current is coupled through the phase-shifting transistor 502-B for biasing in response to the impedance ($Z_{2BB}$) network 503-B to generate a second phase-shifted first-modulated current. The impedance networks 503-A and 503-B respectively can include resistive devices and/or reactive devices selectably arranged in a switching matrix for programmatically selecting a desired impedance for coupling to a respective impedance network 503-A and 503-B.

The first and second phase-shifted first-modulated currents are generated in quadrature or are correctably close to quadrature. The first and second phase-shifted first-modulated currents are coupled respectively to the load network 504 for single-ended to differential coupling.

The load network 504 includes first and second couplers $Z_{1RB}$ and $Z_{2RB}$ (first baseband resistive and second baseband resistive couplers) and a center tap coupled therebetween. The center tap of load network 504 is coupled to $V_{DD}$ such that respective currents flow from the load network 504 through the selected instances 509-A and 509-B. The current sourced from the load network 504 center tap is bifurcated where a first branch includes first phase-shifted first-modulated current information and a second branch includes second phase-shifted first-modulated current information. The first branch flows in a first paralleled path, which is conducted through either of second-frequency modulation input transistors 505-A or 505-C and through the node RFIP coupled to the collector of the pull-up transistor 508-A. The second branch of current flows in a second paralleled path, which is conducted through either of second-frequency modulation input transistors 505-B or 505-D and through the node RFIM coupled to the collector of the pull-up transistor 508-B.

The first and second phase-shifted first-modulated currents are correctably close to quadrature when the phase difference between the first and second phase-shifted first-modulated currents can be changed to 90 degrees by selectively coupling instances 509-A and 509-B. The selectable changes in the current path through the selected instances of 509-A and 509-B can incrementally change the instantaneous current through the respective phase-shifting transistors 502-A and 502-B.

Each selectable instance 509-A includes second-frequency (e.g., LO) modulation input transistors 505-A and 505-B controllably coupled to second-frequency input first impedances ($Z_{1LO}$) 506-A and 506-B, and each selectable instance 509-B includes second-frequency modulation input transistors 505-C and 505-D controllably coupled to second-frequency input second impedances ($Z_{2LO}$) 506-C and 506-D. The second-frequency modulation input transistor 505-A is controllably coupled to a first phase (e.g., "end" or polarity) of a (e.g., LO) second-frequency input signal having been phase shifted in response to the second-frequency input first impedance 506-A, whereas the second frequency modulation input transistor 505-B is controllably coupled to a second phase of the second-frequency input signal having been phase shifted in response to the second-frequency input first impedance 506-B. The second-frequency modulation input transistor 505-D is controllably coupled to the first phase of the second-frequency input signal having been phase shifted in response to the second-frequency input second impedance 506-D, whereas the second frequency modulation input transistor 505-C is controllably coupled to the second phase of the second-frequency input signal having been phase shifted in response to the second-frequency input second impedance 506-C. For example, the first phase of the second-frequency input signal is 180 degrees opposite to the second phase of the second-frequency input signal.

The currents output by second-frequency modulation input transistors 505-A, 505-B, 505-C, and 505-D are scaled by closing respective switches 507-A, 507-B, 507-C, and 507-D (e.g., by selectively coupling selected instances 509-A and 509-B). Scaling the output currents second-frequency modulation input transistors 505-A, 505-B, 505-C, and 505-D changes (and, e.g., corrects for) phase errors in quadrature.

The scaled differential output currents of the second-frequency modulation input transistors 505-A, 505-B, 505-C, and 505-D are converted to respective RF voltages by an active load (e.g., which includes self-biased transistors 508-A and 508-B and impedances $Z_{LRF}$). Pairs of scaled differential output currents are generated by coupling the control terminals of transistors driven by a same polarity of the second-frequency. The pairs of scaled differential output currents of the second-frequency modulation input transistors 505-A, 505-B, 505-C, and 505-D are combined (e.g., summed) to respectively generate the differential RF signals RFIP and RFIM. For example, the currents output by transistors 505-A and 505-C are summed for generating the output signal RFIP, and the currents output by transistors 505-B and 508-D are summed for generating the output signal RFIM. The impedances $Z_{LRF}$ provide a reactive load for phase shifting respective polarities of the second-frequency modulated output currents.

In an example, the differential RF signal is converted to a single-ended output voltage by a differential-to-single-ended conversion element (e.g., balun). As described hereinbelow with reference to FIG. 8, the conversion element is for coupling the single-ended output voltage to a single-ended power amplifier element for transmission via transmitter element antenna 807 (e.g., of a phased array of antennas).

Accordingly, the quadrature up-converting mixer 500 is arranged to "reuse" the current flowing between the RF phase shifter and the LO phase shifter. The first quadrature phase at baseband is implemented using phase shifter elements 503-A and 503-B, while the second quadrature phase at LO is implemented using phase shifter networks 506-A, 506-B, 506-C, and 506-D. The coefficients α (e.g., determined in response to selected instances 509-A) and θ (e.g., determined in response to selected instances 509-B) are trigonometric weights for phase correction, and are implemented by selecting (e.g., coupling) a selected number of paralleled instances 509-A and 509-B, respectively.

In examples, the first-frequency baseband input can be arranged as a differential input. Additionally, the inductor network 504 can be implemented as a magnetically coupled transformer.

Figure 6:
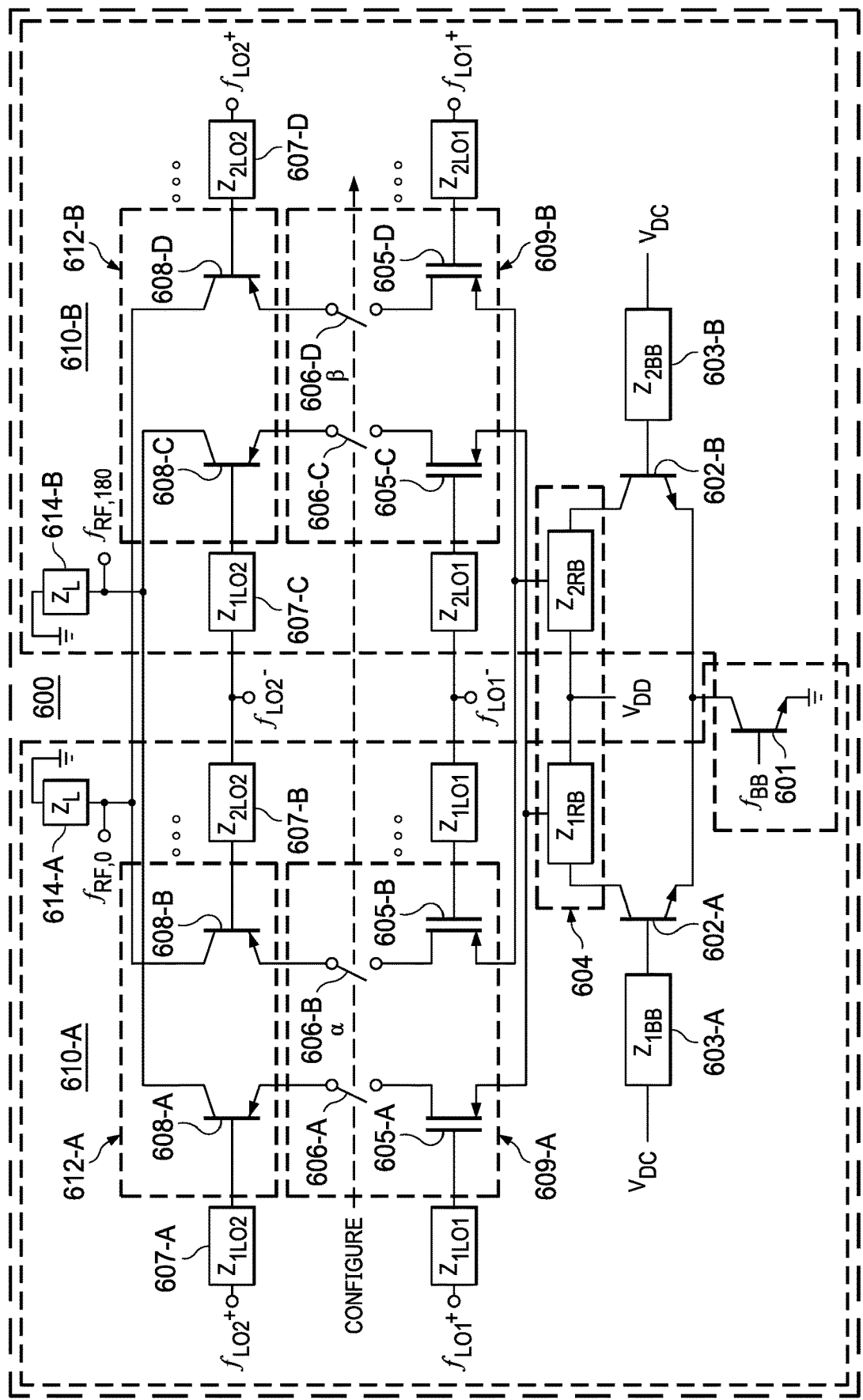
FIG. 6 is a schematic diagram of an example double LO-input up-converting phase shifter mixer architecture in accordance with the description herein.

FIG. 6 is a schematic diagram of an example double LO-input up-converting phase shifter mixer architecture in accordance with the description herein. The quadrature up-converting mixer 600 includes transmission functionality of a subharmonic mixer including frequency multiplication. For example, some wireless transceivers include multiplication functionality, which can be integrated in a system as a super-heterodyne receiver or transmitter.

For example, the quadrature up-converting mixer 600 includes frequency multipliers 612-A and 612-B, where each multiplication stage includes a third-frequency input $f_{LO2}$. Accordingly, the quadrature up-converting mixer 600 includes two LO frequencies, $f_{LO1}$ and $f_{LO2}$, which may be same or different frequencies from each other. The frequency multiplier and the quadrature phase shifter reuse the bias current in the stack, leading to a low power implementation. Subharmonic mixers can be included in some wireless transmitters, where the first and/or second LO frequencies can be lower than the RF frequency, and the LO pulling effects (e.g., phase/frequency shifting caused by sympathetic resonance) from the antenna are thereby reduced.

The quadrature up-converting mixer 600 includes a first-frequency (e.g., baseband) modulation input transistor 601 for converting a first input signal (e.g., $f_{BB}$) to a first first-frequency modulated current (e.g., which is for phase shifting in accordance with the impedance network 603-A) and to a second first-frequency modulated current (e.g., which is for phase shifting in accordance with the impedance network 603-B).

The first first-frequency modulated current is coupled through the phase-shifting transistor 602-A for biasing in response to the impedance network ($Z_{1BB}$) 603-A to generate a first phase-shifted first-modulated current. The second first-frequency modulated current is coupled through the phase-shifting transistor 602-B for biasing in response to the impedance network ($Z_{2BB}$) 603-B to generate a second phase-shifted first-modulated current. The impedance networks 603-A and 603-B respectively can include resistive devices and/or reactive devices selectably arranged in a switching matrix for programmatically selecting a desired impedance for coupling to a respective impedance network 603-A and 603-B.

The first and second phase-shifted first-modulated currents are generated in quadrature or are correctably close to quadrature. The first and second phase-shifted first-modulated currents are coupled respectively to the load network 604 for single-ended to differential coupling.

The load network 604 includes first and second couplers $Z_{1RB}$ and $Z_{2RB}$ (first baseband resistive and second baseband resistive couplers) and a center tap coupled therebetween. The load network 604 center tap is coupled to $V_{DD}$ such that respective currents flow from the load network 604 through the selected instances 609-A and 609-B. The current sourced from the load network 604 center tap is bifurcated where a first branch includes first phase-shifted first-modulated current information and a second branch includes second phase-shifted first-modulated current information. The first branch flows in a first paralleled path, which is conducted through either of second-frequency modulation input transistors 605-A or 605-C and through the node $f_{RF,180}$ coupled to the collector of the pull-up transistors 608-A or 608-C. The second branch of current flows in a second paralleled path, which is conducted through either of second-frequency modulation input transistors 605-B or 605-D and through the node $f_{RF,0}$ coupled to the collector of the pull-up transistor 608-B and 608-D.

The first and second phase-shifted first-modulated currents are correctably close to quadrature when the phase difference between the first and second phase-shifted first-modulated currents can be changed to 90 degrees by selectively coupling instances 609-A and 609-B (and 612-A and 612-B). The selectable changes in the current path through the selected instances of 609-A and 609-B (and 612-A and 612-B) can incrementally change the instantaneous current through the respective phase-shifting transistors 602-A and 602-B.

Each selectable instance 609-A includes second-frequency (e.g., LO1) modulation input transistors 605-A and 605-B controllably coupled to second-frequency input first impedances ($Z_{1LO1}$) 606-A and 606-B, and each selectable instance 609-B includes second-frequency modulation input transistors 605-C and 605-D controllably coupled to second-frequency input second impedances ($Z_{2LO1}$) 606-C and 606-D. The second-frequency modulation input transistor 605-A is controllably coupled to a first phase of a second-frequency input signal having been phase shifted in response to the second-frequency input first impedance $Z_{1LO1}$, whereas the second frequency modulation input transistor 605-B is controllably coupled to a second phase of the second-frequency input signal having been phase shifted in response to the second-frequency input first impedance $Z_{1LO1}$. The second-frequency modulation input transistor 605-D is controllably coupled to the first phase of the second-frequency input signal having been phase shifted in response to the second-frequency input second impedance $Z_{2LO1}$, whereas the second frequency modulation input transistor 605-C is controllably coupled to the second phase of the second-frequency input signal having been phase shifted in response to the second-frequency input second impedance $Z_{2LO1}$. For example, the first phase of the second-frequency input signal is 180 degrees opposite to the second phase of the second-frequency input signal.

The currents output by second-frequency modulation input transistors 605-A, 605-B, 605-C, and 605-D are scaled by closing respective switches 606-A, 606-B, 606-C, and 606-D (e.g., by selectively coupling selected instances 609-A and 609-B). Scaling the output currents second-frequency modulation input transistors 605-A, 605-B, 605-C, and 605-D changes (and, e.g., corrects for) phase errors in quadrature.

The scaled differential output currents of the second-frequency modulation input transistors 605-A, 605-B, 605-C, and 605-D are coupled respectively to (e.g., emitters or sources of) the third-frequency modulation input transistors 608-A, 608-B, 608-C, and 608-D. Each frequency multiplier 612-A is an instance (e.g., of many such instances) selectable in tandem with a selection of a corresponding selectable instance 609-A and each multiplier 612-B is an instance selectable in tandem with a selection of a corresponding selectable instance 609-B.

Each frequency multiplier 612-A includes third-frequency (e.g., LO2) modulation input transistors 608-A and 608-B. The third-frequency modulation input transistor 608-A is controllably coupled to a first phase of a third-frequency input signal having been phase shifted in response to the third-frequency input first impedance $Z_{1LO2}$, whereas the third-frequency modulation input transistor 608-B is controllably coupled to a second phase of a third-frequency input signal having been phase shifted in response to the third-frequency input second impedance $Z_{2LO2}$.

Each frequency multiplier 612-B includes third-frequency (e.g., LO2) modulation input transistors 608-C and 608-D. The third-frequency modulation input transistor 608-D is controllably coupled to a second phase of a third-frequency input signal having been phase shifted in response to the third-frequency input first impedance $Z_{1LO2}$, whereas the third-frequency modulation input transistor 608-D is controllably coupled to a first phase of a third-frequency input signal having been phase shifted in response to the third-frequency input second impedance $Z_{2LO2}$.

The outputs of the frequency multipliers 612-A and 612-B are converted to in-phase and quadrature RF voltages by an RF phase shifter (e.g., which includes impedances $Z_L$ 614-A and 614-B). For example, the currents output by transistors 608-A and 608-C are summed for generating the output signal $f_{RF,180}$, while the currents output by transistors 608-B and 608-D are summed for generating the output signal $f_{RF,0}$. The impedances $Z_L$ provide a reactive load for phase shifting respective polarities of the second-frequency modulated output currents.

In an example, the differential RF signal is converted to a single-ended (e.g., beamforming) output voltage by a differential-to-single-ended conversion element (e.g., balun). As described hereinbelow with reference to FIG. 8, the conversion element is for coupling the single-ended beamforming output voltage to a single-ended power amplifier element for transmission via transmitter element antenna 807 (e.g., of a phased array of antenna).

Figure 7:
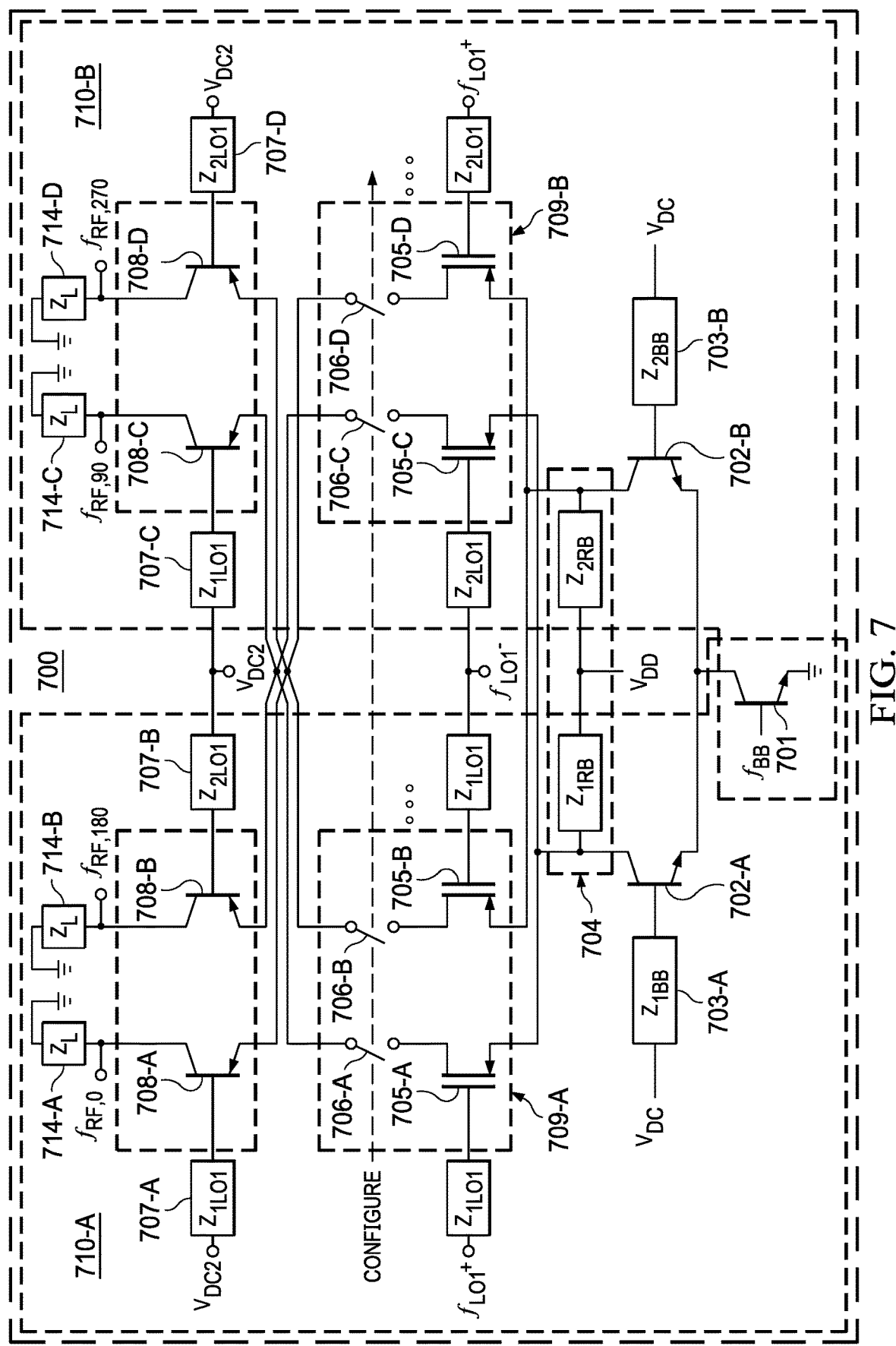
FIG. 7 is a schematic diagram of an example four-phase quadrature phase shifter mixer architecture in accordance with the description herein.

FIG. 7 is a schematic diagram of an example four-phase quadrature phase shifter mixer architecture in accordance with the description herein. The phase-interpolating quadrature up-converting mixer 700 includes phase interpolation (e.g., vector modulation) functionality for generating a four-phase quadrature RF output (e.g., in which the four phases are separated by a similar phase angle, such as 90 degrees). For example, the phase-interpolating quadrature up-converting mixer 700 can be integrated in a system as a superheterodyne transceiver, receiver or transmitter. The phase-interpolating quadrature up-converting mixer 700 can generate quadrature signals phase shifted in quadrature in response to a received LO signal (e.g., differential LO input signal) and phase interpolates the phase shifted quadrature signals to generate phase interpolated quadrature output signals.

The phase-interpolating quadrature up-converting mixer 700 includes a first-frequency (e.g., baseband) modulation input transistor 701 for converting a first input signal (e.g., $f_{BB}$) to a first first-frequency modulated current (e.g., which is for phase shifting in accordance with the impedance network 703-A) and to a second first-frequency modulated current (e.g., which is for phase shifting in accordance with the impedance network 703-B).

The first first-frequency modulated current is coupled through a first-level phase-shifting transistor 702-A for biasing in response to the impedance network ($Z_{1BB}$) 703-A to generate a first phase-shifted first-modulated current. The second first-frequency modulated current is coupled through the first-level phase-shifting transistor 702-B for biasing in response to the impedance network ($Z_{2BB}$) 703-B to generate a second phase-shifted first-modulated current. The impedance networks 703-A and 703-B respectively can include resistive devices and/or reactive devices selectably arranged in a switching matrix for programmatically selecting a desired impedance for coupling to a respective impedance network 703-A and 703-B.

The first and second phase-shifted first-modulated currents are generated in quadrature or are correctably close to quadrature. The first and second phase-shifted first-modulated currents are coupled respectively to the inductor network 704 for single-ended to differential coupling.

The inductor network 704 includes first and second autotransformers $Z_{LBB}$ (baseband inductive impedance) and a center tap coupled therebetween. The inductor network 704 center tap is coupled to $V_{DD}$ such that respective currents flow from the inductor network 704 through the selected instances 709-A and 709-B. The current sourced from the inductor network 704 center tap is bifurcated where a first branch includes first phase-shifted first-modulated current information and a second branch includes second phase-shifted first-modulated current information. The first branch flows in a first paralleled path, which is conducted through either of second-frequency modulation input transistors 705-A or 705-C and coupled to the respective emitters of the second-level phase-shifting transistors 708-B and 708-C. The second branch of current flows in a second paralleled path, which is conducted through either of second-frequency modulation input transistors 705-B or 705-D and coupled to the respective emitters of the second-level phase-shifting transistors 708-A and 708-D.

The first and second phase-shifted first-modulated currents are correctably close to quadrature when the phase difference between the first and second phase-shifted first-modulated currents can be changed (e.g., adjusted) to 90 degrees by selectively coupling instances 709-A and 709-B. The selectable changes in the current path through the selected instances of 709-A and 709-B can incrementally change the instantaneous current through the respective phase-shifting transistors 702-A and 702-B.

Each selectable instance 709-A includes second-frequency (e.g., LO1) modulation input transistors 705-A and 705-B controllably coupled to second-frequency input first impedances ($Z_{1LO1}$) 706-A and 706-B, and each selectable instance 709-B includes second-frequency modulation input transistors 705-C and 705-D controllably coupled to second-frequency input second impedances ($Z_{2LO1}$) 706-C and 706-D. The second-frequency modulation input transistor 705-A is controllably coupled to a first phase of a second-frequency input signal having been phase shifted in response to the second-frequency input first impedance $Z_{1LO1}$, whereas the second frequency modulation input transistor 705-B is controllably coupled to a second phase of the second-frequency input signal having been phase shifted in response to the second-frequency input first impedance $Z_{1LO1}$. The second-frequency modulation input transistor 705-D is controllably coupled to the first phase of the second-frequency input signal having been phase shifted in response to the second-frequency input second impedance $Z_{2LO1}$, whereas the second frequency modulation input transistor 705-C is controllably coupled to the second phase of the second-frequency input signal having been phase shifted in response to the second-frequency input second impedance $Z_{2LO1}$. For example, the first phase of the second-frequency input signal is 180 degrees opposite to the second phase of the second-frequency input signal.

The currents output by second-frequency modulation input transistors 705-A, 705-B, 705-C, and 705-D are scaled by closing respective switches 706-A, 706-B, 706-C, and 706-D (e.g., by selectively coupling selected instances 709-A and 709-B). Scaling the output currents second-frequency modulation input transistors 705-A, 705-B, 705-C, and 705-D changes (and, e.g., corrects) for phase errors in quadrature. Each selectable instance 709-A is independently selectable from a selection of each selectable instance 709-B.

The scaled differential output currents of the second-frequency modulation input transistors 705-A and 705-C are used to generate a first-phase scaled first- and second-modulated current coupled to (e.g., emitters or sources of) the second-level phase-shifting transistors 708-B and 708-C, whereas the scaled differential output currents of the second-frequency modulation input transistors 705-B and 705-D are used to generate a second-phase scaled first- and second-modulated current coupled to (e.g., emitters or sources of) the second-level phase-shifting transistors 708-A and 708-D.

The second-level phase-shifting transistors 708-A, 708-B, 708-C, and 708-D can phase shift two input phases and in response generate four output phases. For example, each of the generated four output phases can be separated from an angularly adjacent phase by 90 degrees.

For example, the second-level phase-shifting transistor 708-A is (e.g., AC- and DC-component induced) biased in response to the impedance network ($Z_{1LO1}$) 707-A and voltage $V_{DC2}$ to generate a first twice-phase-shifted twice-modulated current. The first twice-phase-shifted twice-modulated current is converted to a voltage (e.g., output signal $f_{RF,0}$) in response to the load network impedance $Z_L$ 714-A. The second-level phase-shifting transistor 708-B is (e.g., AC- and DC-component induced) biased in response to the impedance network ($Z_{2LO1}$) 707-B and voltage $V_{DC2}$ to generate a second twice-phase-shifted twice-modulated current. The second twice-phase-shifted twice-modulated current is converted to a voltage (e.g., output signal $f_{RF,180}$) in response to the load network impedance $Z_L$ 714-B. The second-level phase-shifting transistor 708-C is (e.g., AC- and DC-component induced) biased in response to the impedance network ($Z_{1LO1}$) 707-C and voltage $V_{DC2}$ to generate a third twice-phase-shifted twice-modulated current. The third twice-phase-shifted twice-modulated current is converted to a voltage (e.g., output signal $f_{RF,90}$) in response to the load network impedance $Z_L$ 714-C. The second-level phase-shifting transistor 708-D is (e.g., AC- and DC-component induced) biased in response to the impedance network ($Z_{2LO1}$) 707-D and voltage $V_{DC2}$ to generate a fourth twice-phase-shifted twice-modulated current. The fourth twice-phase-shifted twice-modulated current is converted to a voltage (e.g., output signal $f_{RF,270}$) in response to the load network impedance $Z_L$ 714-D.

The second-level phase-shifting transistors 708-A, 708-B, 708-C, and 708-D are each AC-biased in a manner similar to the biasing of the first-level phase-shifting transistor 702-B described hereinabove. In a similar manner to the selection of instances of 709-A and 709-B, as described hereinabove, one or more particular instances M (from a paralleled array of N such instances) of each of the second-level phase-shifting transistors 708-A, 708-B, 708-C, and 708-D can be respectively and selectively coupled to adjust scaling and phasing of voltages developed at a one of a respective load network impedance $Z_L$ 714-A, 714-B, 714-C, and 714-D. The impedances $Z_L$ can provide a reactive load for phase shifting respective twice-phase-shifted twice-modulated currents.

In an example, a respective phase-shifted twice-modulated output currents from a respective transistor 705-A, 705-B, 705-C, and 705-D can be weighted in accordance with selected scalar factors by closing respective switches 706-A, 706-B, 706-C, and 706-D. The scaled phase-shifted twice-modulated output currents are generated in quadrature at a frequency determined in the response to the baseband and LO1 frequency inputs (e.g., $f_{BB}$ and $f_{LO1}$). Each current of the respective phase of the scaled phase-shifted twice-modulated output currents is coupled to a 708-A, 708-B, 708-C, and 708-D for phase shifting in accordance with a respective phase shifter networks 707-A,B,C,D. These provide quadrature output phases of 0, 180, 90 and 270 degrees using the load networks 709-A,B,C,D. As the current is shared among multiple functionalities, the implementation is relatively low power.

As described herein, MIMO—(multiple-input, multiple-output-) based transmitters and receivers achieve higher effective output and input power by controlling an array of multiple low power transmitter and receiver elements for working concurrently and in parallel with like elements. For example, transmitter elements include an "in-phase" digital-to-analog converter (DAC), an in-phase baseband analog filter for modulating the output of the in-phase DAC, a quadrature DAC, a quadrature baseband analog filter for modulating the output of the quadrature DAC, an up-converting mixer for combining the outputs of the in-phase and quadrature baseband filters, and amplifiers for amplifying the output of the up-converting mixer and for coupling the amplified output to a respective antenna. Each of the selected number M of multiple low power transmitter elements works concurrently, for example, where each power transmitter element transmits a respective signal having a different phase shift from the signals being transmitted by adjacent transmitter elements. (Adjacent transmitter elements can include contiguous transmitter elements arranged in a row and/or column.) The cooperation of the concurrently working multiple transmitter elements increases, for example, the effective transmitted power (e.g., via focusing the transmitted beam) and/or the signal-to-noise ratio of the transmitted waveforms.

Similarly, MIMO-based receivers include an array of receiver elements, where each power receiver element is coupled to a respective antenna in an antenna array, where individual antennas are physically separated from an adjacent antenna by a faction of wavelength (e.g., half wavelength). A receiver element includes, for example, amplifiers for amplifying the input signal received from a respective antenna, an in-phase filter for filtering the amplified input signal, an in-phase analog-to-digital converter (ADC) for digitizing the in-phase filtered amplified input signal and coupling the digitized in-phase values to a digital signal processor (DSP), a quadrature filter for filtering the amplified input signal, quadrature ADC for digitizing the quadrature filtered amplified input signal and coupling the digitized quadrature values to the DSP. The DSP is a "back-end" processor arranged to phase shift and combine each of the digitized quadrature values from each respective receiver element such that, for example, the effective gain of the antenna array is boosted.

For example, each of the M receiver elements in the receiver element array is selectively phase shifted for constructive combination by receiver back-end (e.g., digital) processing of the signals received by the selectively phase shifted M receiver elements in the receiver element array. The constructive combination of the receiver back-end processing achieves a higher signal-to-noise (SNR) ratio for the combined signal when compared to any one of the individually received signals (e.g., based on each copy of the signals being correlated and constructively added in-phase, while noise is uncorrelated). Spatial filtering of the received signals is achieved, for example, by constructive combination of a receiver back-end processing. Accordingly, the back-end processing results in higher effective signal-to-noise ratio as compared to the SNR of each of the individual waveforms of the received signal obtained from a respective receiver element.

MIMO transmitters and receivers (e.g., including transceivers) are used extensively in emerging applications such as automotive radar as well as data communication integrated circuits (ICs) for next-generation communication systems (e.g., 5G-level services). To improve efficiencies, communication systems using MIMO technologies are typically implemented in a compact, power efficient manner. To improve cost effectiveness, a maximally reusable architecture is described as being scalable in accordance with certain designated multiple radio frequency (RF) bands of usage (e.g., where emerging systems are designed for operation within the 28 GHz and 35 GHz bands). Such systems are proposed to use arrays of between 64 and 512 antennas (e.g., in accordance with a power of two) using large arrays of compact antennas for handheld devices and base stations, where the handheld devices and the base stations include tiles, where each tile contains four antenna arrays. In various examples, receivers and transmitters are described for processing two center frequencies (e.g., 28 GHz and 35 GHz).

As system complexity and levels of integration grow, MIMO-based systems increasingly employ transmitter and receivers of low power and low area for achieving commercially viable solutions. In accordance with various communications standards, a single-sideband RF output is often required at the antenna (e.g., antenna array).

In a first transmitter architecture, signals in quadrature (e.g., having an in-phase signal and a quadrature signal in a quadrature phase relationship to the in-phase signal) at baseband frequencies are mixed with stages of quadrature local oscillator signals (e.g., for generating single sideband RF transmit signals for transmission). The first transmitter architecture is typically suitable for integrated system-on-chip implementation.

In a second transmitter architecture, the transmitter generates the signals in quadrature by phase shifting band-limited local oscillator analog signals (e.g., where the single sideband RF transmit signals for transmission are generated by one or more mixer stages, where each mixer stage is responsive to local oscillator signals in quadrature, where the local oscillator signals in quadrature are generated in accordance with a selected frequency).

The first and second transmitter architectures are applicable to respective first and second receiver architectures where, for example, the output of the down-conversion RF circuitry can be a differential signal (in accordance with the first receiver example) or quadrature differential signals at analog/baseband frequency levels (in accordance with the second receiver example).

Various transmitter architectures using mixers for generating output signals are responsive to quadrature input signals and quadrature local oscillator (LO) signals in accordance with:

$$\cos(\omega_{LO}+\omega_{BB})t = \cos(\omega_{LO}\,t)\cos(\omega_{BB}t) - \sin(\omega_{LO}t)\sin(\omega_{BB}\,t) \quad \text{(Eq. 14)}$$

where $\omega_{BB}$ is a first quadrature input signal at a baseband frequency, $\omega_{LO}$ is a second quadrature input signal having a frequency higher than a baseband frequency and t is time. The first and second quadrature input signals each include a first signal and a second signal having the frequency of the included first signal and having a 90-degree phase relationship with the included first signal.

Figure 8:
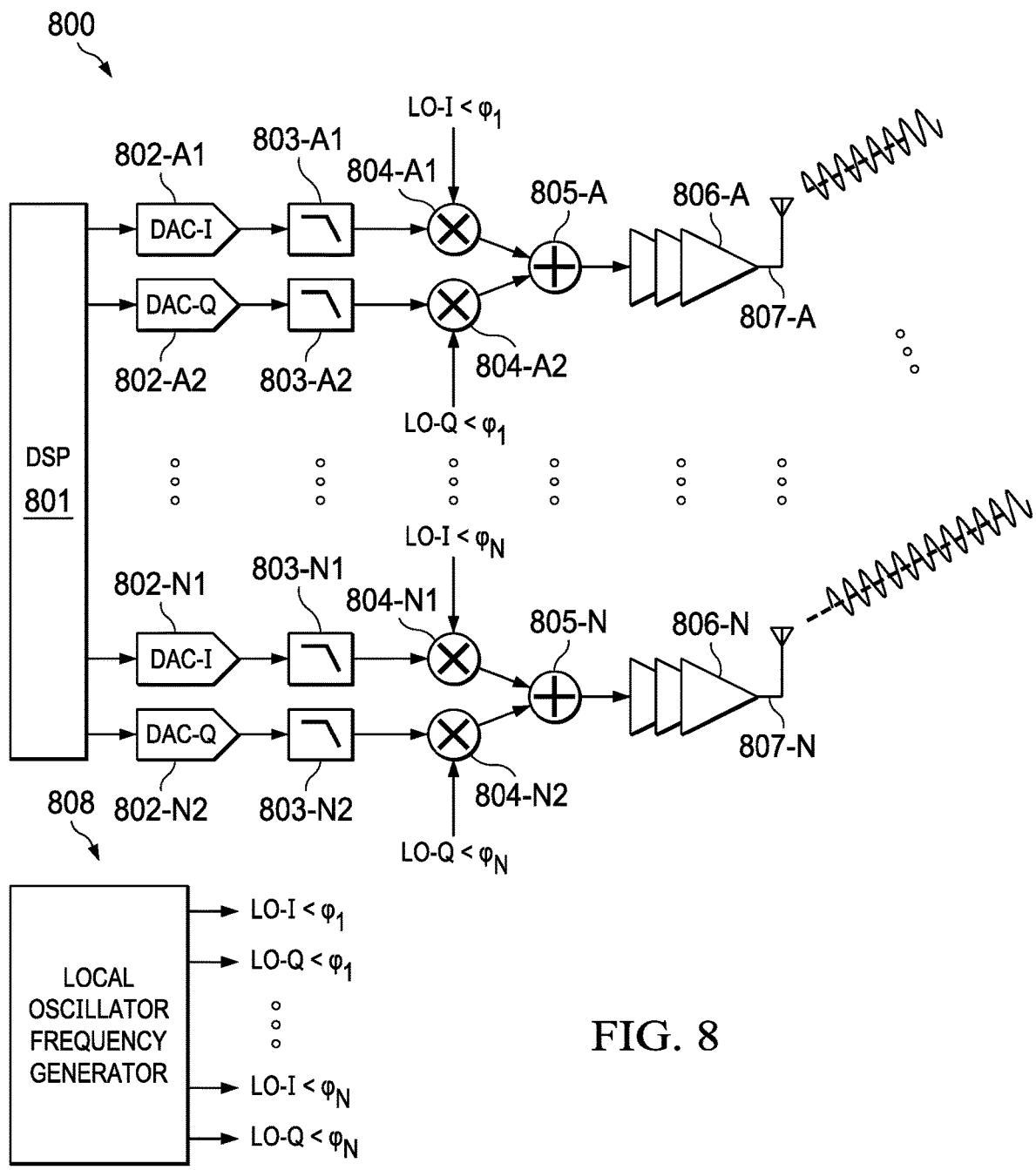
FIG. 8 is a schematic diagram of an example architecture of a beam-focusing MIMO transmitter.

FIG. 8 is a schematic diagram of an example architecture of a beam-focusing MIMO transmitter 800. The digital signal processing element 801 is arranged for back-end signal processing (e.g., processing of signals for transmitting and processing of digitized received signals). The digital signal processing element 801 generates transmit data and phase information for transmitting a selected output signal. The transmit data and phase information is transferred to a number N of quadrature DACs (to digital-to-analog converters 802-A1 and 802-A2 for a first channel and to a sequence of (e.g., the selected number of) N channels extending to DACs 802-N1 and 802-N2 for the last channel). The number N of baseband filters (803-A1 and 803-A2 and a sequence of baseband filters extending to 803-N1 and 803-N2) are arranged for reducing aliasing and harmonics of the respective baseband signal generated by the respective quadrature digital-to-analog converters (e.g., DACs 802-A1 and 802-A2 through 802-N1 and 802-N2). After the baseband signal is filtered by the anti-aliasing filters (e.g., filters 803-A1 and 803-A2 through 803-N1 and 803-N2), the filtered baseband signals are respectively up-converted using a number N of up-converting quadrature mixers (mixers 804-A1 and 804-A2 through 804-N1 and 804-N2), which (e.g., after summation by the sequence of summing nodes 805-A through 805-N) output a respective up-converted signal coupled to an input of a number N of the high frequency power amplifiers (806-A and the sequence of amplifiers extending to 806-N). The outputs of the high frequency power amplifiers are respectively coupled to each the antennas (807-A and the sequence of antennas extending to 807-N). The beam-focusing MIMO transmitter 800 includes a phase shifter 808 (similar to phase shifting mixers 500, 600, and 700 described hereinabove) for generating LO signals and quadrature.

The up-converting quadrature mixers (mixers 804-A1 and 804-A2 through 804-N1 and 804-N2) and the summing node 805-A through 805-N can be mixers such as the quadrature up-converting mixer 500, the quadrature up-converting mixer 600, and the phase-interpolating quadrature up-converting mixer 700 described hereinabove. The up-converting quadrature mixers collectively can be multiply instantiated as instances of a beamforming transmitter array.

Figure 9A:
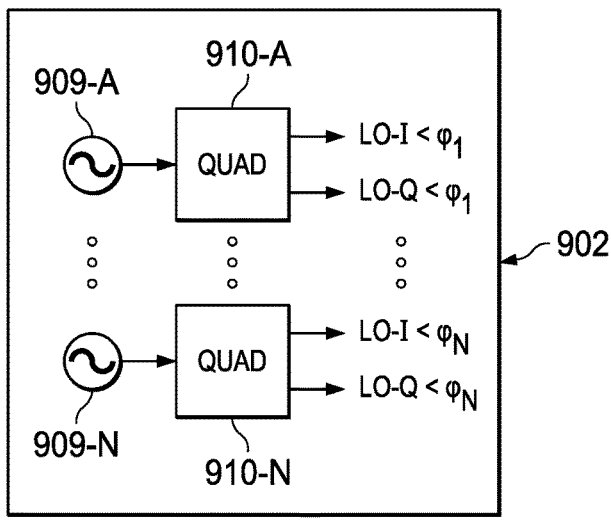
FIG. 9A is a schematic diagram of a first example of a phase shifter for generating LO signals in quadrature.

FIG. 9A is a schematic diagram of a first example of a phase shifter 902 for generating LO signals in quadrature. The phase shifter 902 is a phase shifter such as phase shifter 808 and includes a number N voltage-controlled oscillators (VCOs 909-A and the sequence of VCOs extending to 909-N), where each of the N number of VCOs (e.g., 909) includes an output coupled to a respective set of inputs of each of the quadrature (QUAD) dividers (910-A and the sequence of dividers extending to 910-N). The phase shifter 902 example is suitable (for example) for VCOs where each such VCO covers a narrow tuning range, and where many such VCOs (e.g., where each of the VCOs covers a different frequency range of a larger frequency range) are used to cover an entire frequency range of coverage (e.g., by selecting a particular VCO capable of operating at a target frequency within the frequency range of coverage). The respective outputs (e.g., LO-I and LO-Q) of each of the quadrature dividers (e.g., 910-A through 910-N) are output to a respective mixer in accordance with ("<") signals $\phi_1$ through $\phi_N$. The quadrature divider outputs are differentially coupled to respective up-converting mixers (e.g., a respective pair of the up-converting mixers 804).

Figure 9B:
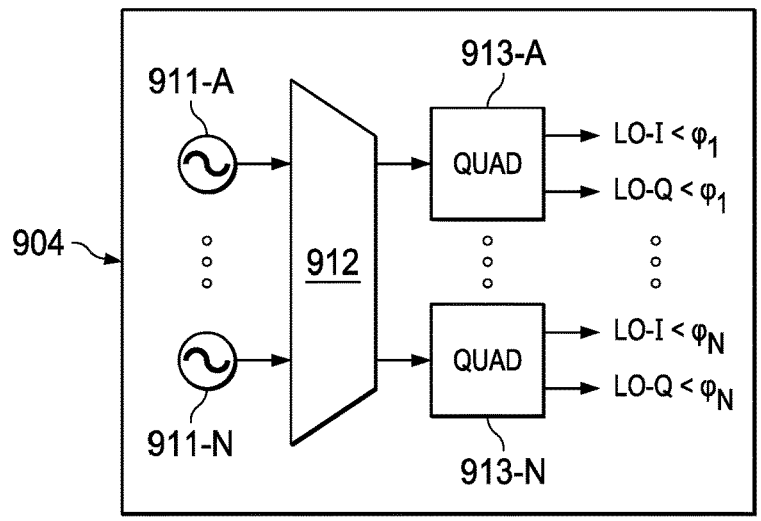
FIG. 9B is a schematic diagram of a second example of a phase shifter for generating LO signals in quadrature.

FIG. 9B is a schematic diagram of a second example of a phase shifter 904 for generating LO signals in quadrature. The phase shifter 904 is a phase shifter such as phase shifter 808 and shows a configuration where the oscillators (911-A through 911-N) are multiplexed via a multiplexer 912, which in turn selectively outputs a selected baseband signal generated by a selected one of a number N VCOs (911-A and the sequence of VCOs to 911-N) and provided the selected output to the number N of quadrature dividers (913-A and the sequence of dividers to 913-N) to obtain the quadrature outputs for respectively coupling to a respective pair of the number of N mixers (e.g., up-converting mixers) 804.

Figure 9C:
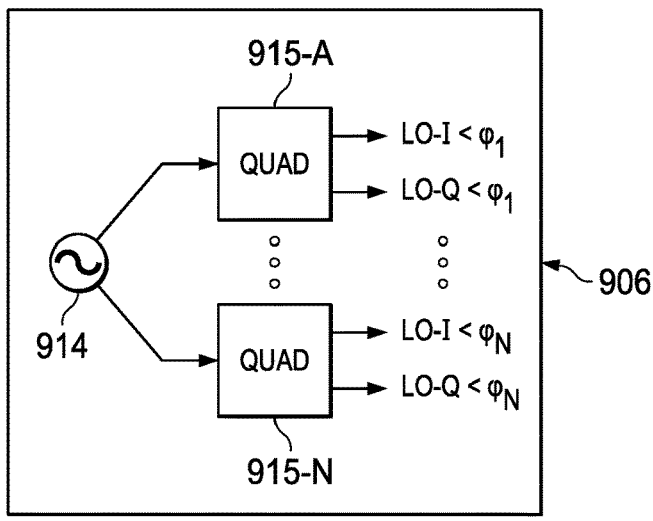
FIG. 9C is a schematic diagram of a third example of a phase shifter for generating LO signals in quadrature.

FIG. 9C is a schematic diagram of a third example of a phase shifter 906 for generating LO signals in quadrature. The phase shifter 906 is a phase shifter such as phase shifter 808 and shows a configuration where the output of a VCO 914 is provided to a number N of quadrature dividers (915-A through 915-N), where each quadrature divider 915 provides quadrature outputs coupled to a respective N quadrature up-conversion mixer. Accordingly, the phase shifter 906 is suitable for receiving an input signal from a wide tuning range VCO.

What is claimed is:

1. A circuit comprising:
    an input transistor configured to receive an input signal at a first frequency;
    a first phase generator that includes:
        a first phasing transistor coupled to the input transistor;
        a first modulator configured to receive a modulation signal at a second frequency that is different than the first frequency; and
        a first differential output coupled to the first modulator;
    a second phase generator that includes:
        a second phasing transistor coupled to the input transistor;
        a second modulator configured to receive the modulation signal; and
        a second differential output coupled to the second modulator;
    a first transformer inductively coupled between the first modulator and the first phasing transistor; and
    a second transformer inductively coupled between the second modulator and the second phasing transistor.

2. The circuit of claim 1, wherein the first modulator includes a first plurality of instances coupled in parallel that each include:
    a first transistor coupled to the first transformer and coupled to receive a first polarity of the modulation signal;
    a first switch coupled between the first transistor and a first polarity of the first differential output;
    a second transistor coupled to the second transformer and coupled to receive a second polarity of the modulation signal; and
    a second switch coupled between the second transistor and a second polarity of the first differential output.

3. The circuit of claim 2, wherein the second modulator includes a second plurality of instances coupled in parallel that each include:
    a third transistor coupled to the first transformer and coupled to receive the second polarity of the modulation signal;
    a third switch coupled between the third transistor and a first polarity of the second differential output;
    a fourth transistor coupled to the second transformer and coupled to receive the first polarity of the modulation signal; and
    a fourth switch coupled between the fourth transistor and a second polarity of the second differential output.

4. The circuit of claim 3, wherein the circuit is configured to enable a subset of the first and second transistors of the first plurality of instances and a subset of the third and fourth transistors of the second plurality of instances to correct a phase error.

5. The circuit of claim 4, wherein:
    the first phasing transistor is coupled to a first biasing network;
    the second phasing transistor is coupled to a second biasing network; and
    the phase error is based on at least one of the first biasing network and the second biasing network.

6. The circuit of claim 1, wherein the first differential output is an in-phase differential output and the second differential output is a quadrature differential output.

7. The circuit of claim 1, wherein:
    the first transformer includes a first center tap coupled to a first voltage source; and
    the second transformer includes a second center tap coupled to the first voltage source.

8. The circuit of claim 7, wherein the first phasing transistor and the second phasing transistor are each coupled to a second voltage source that is different from the first voltage source.

9. The circuit of claim 8, wherein:
    the first phasing transistor is coupled to the second voltage source by a first biasing network configured such that the first phasing transistor provides an in-phase current through the input transistor; and
    the second phasing transistor is coupled to the second voltage source by a second biasing network configured such that the second phasing transistor provides a quadrature current through the input transistor.

10. The circuit of claim 1, wherein the first frequency is a radio-frequency frequency and the second frequency is a baseband frequency.

11. A circuit comprising:
    an input transistor that includes a base configured to receive an input signal;
    an in-phase phase generator that includes:
        a first biasing network;
        an in-phase phasing transistor coupled to the input transistor that includes a base coupled to the first biasing network;
        an in-phase modulator configured to receive a modulation signal;
        an in-phase differential output coupled to the in-phase modulator; and
    a quadrature phase generator that includes:
        a second biasing network;
        a quadrature phasing transistor coupled to the input transistor that includes a base coupled to the second biasing network;

a quadrature modulator configured to receive the modulation signal;
a quadrature differential output coupled to the quadrature modulator; and
a first transformer inductively coupled between the in-phase modulator and the in-phase phasing transistor; and
a second transformer inductively coupled between the quadrature modulator and the quadrature phasing transistor.

12. The circuit of claim 11, wherein the in-phase modulator includes a first plurality of instances coupled in parallel that each include:
a first transistor coupled to the first inductor portion of the autotransformer and that includes a gate coupled to receive a first polarity of the modulation signal;
a first switch coupled between the first transistor and a first polarity of the in-phase differential output;
a second transistor coupled to the second inductor portion of the autotransformer and that includes a gate coupled to receive a second polarity of the modulation signal; and
a second switch coupled between the second transistor and a second polarity of the in-phase differential output.

13. The circuit of claim 12, wherein the quadrature modulator includes a second plurality of instances coupled in parallel that each include:
a third transistor coupled to the first transformer and that includes a gate coupled to receive the second polarity of the modulation signal;
a third switch coupled between the third transistor and a first polarity of the quadrature differential output;
a fourth transistor coupled to the second transformer and that includes a gate coupled to receive the first polarity of the modulation signal; and
a fourth switch coupled between the fourth transistor and a second polarity of the quadrature differential output.

14. The circuit of claim 13, wherein the circuit is configured to enable a subset of the first transistors, a subset of the second transistors, a subset of the third transistors, and a subset of the fourth transistors to correct a phase error.

15. The circuit of claim 14, wherein the phase error is due to at least one of the first biasing network and the second biasing network.

16. The circuit of claim 11, wherein the first biasing network includes:
a first transistor that includes a base, a collector coupled to a first polarity of the in-phase differential output, and an emitter coupled to ground;
a second transistor that includes a base coupled to the base of the first transistor, a collector coupled to a second polarity of the in-phase differential output, and an emitter coupled to ground;
a first resistor coupled between the first polarity of the in-phase differential output and the base of the first transistor; and
a second resistor coupled between the second polarity of the in-phase differential output and the base of the second transistor.

17. The circuit of claim 11, wherein:
the first transformer includes a first center tap coupled to a first voltage source; and
the second transformer includes a second center tap coupled to the first voltage source.

18. The circuit of claim 17, wherein:
the first biasing network is coupled between the base of the in-phase phasing transistor and a second voltage source that is different from the first voltage source; and
the second biasing network is coupled between the base of the quadrature phasing transistor and the second voltage source.

19. The circuit of claim 11, wherein:
the first biasing network is configured such that the in-phase phasing transistor is configured to provide an in-phase current through the input transistor; and
the second biasing network is configured such that the quadrature phasing transistor is configured to provide a quadrature current through the input transistor.

20. The circuit of claim 11, wherein:
the input signal is a radio-frequency input signal;
the in-phase differential output is configured to provide an in-phase baseband signal; and
the quadrature differential output is configured to provide a quadrature baseband signal.

* * * * *